United States Patent
Imai et al.

(10) Patent No.: US 11,569,324 B2
(45) Date of Patent: Jan. 31, 2023

(54) ACTIVE MATRIX SUBSTRATE AND METHOD FOR MANUFACTURING SAME

(71) Applicant: Sharp Kabushiki Kaisha, Osaka (JP)

(72) Inventors: Hajime Imai, Sakai (JP); Tohru Daitoh, Sakai (JP); Teruyuki Ueda, Sakai (JP); Yoshihito Hara, Sakai (JP); Masaki Maeda, Sakai (JP); Tatsuya Kawasaki, Sakai (JP); Yoshiharu Hirata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 70 days.

(21) Appl. No.: 17/338,750

(22) Filed: Jun. 4, 2021

(65) Prior Publication Data

US 2021/0384276 A1    Dec. 9, 2021

(30) Foreign Application Priority Data

Jun. 5, 2020   (JP) .............................. JP2020-098520

(51) Int. Cl.
*H01L 27/32*   (2006.01)
*H01L 29/66*   (2006.01)
*H01L 29/786*   (2006.01)

(52) U.S. Cl.
CPC .... *H01L 27/3262* (2013.01); *H01L 29/66742* (2013.01); *H01L 29/7869* (2013.01); *H01L 29/78618* (2013.01); *H01L 2227/323* (2013.01)

(58) Field of Classification Search
CPC ............. H01L 27/3262; H01L 27/0207; H01L 27/1225; H01L 27/1259; H01L 29/66742;
(Continued)

(56) References Cited

U.S. PATENT DOCUMENTS 8,502,225 B2 * 8/2013 Yamazaki ............. H01L 27/127
257/222
11,201,201 B2 * 12/2021 Bae ...................... H01L 27/3248
(Continued)

FOREIGN PATENT DOCUMENTS

JP   2006-119404 A   5/2006
JP   2008-225036 A   9/2008
(Continued)

*Primary Examiner* — Nikolay K Yushin
(74) *Attorney, Agent, or Firm* — Keating & Bennett, LLP

(57) ABSTRACT

An active matrix substrate includes a first TFT and a second TFT, in which the first TFT includes a first oxide semiconductor layer and a first gate electrode arranged on a part of the first oxide semiconductor layer with a first gate insulating layer interposed therebetween, the first gate insulating layer has a layered structure including a first insulating film and a second insulating film arranged on the first insulating film, the second TFT includes a second oxide semiconductor layer having a higher mobility than the first oxide semiconductor layer and a second gate electrode arranged on a part of the second oxide semiconductor layer with a second gate insulating layer interposed therebetween, and the second gate insulating layer includes the second insulating film and does not include the first insulating film, and the second TFT further includes a lower insulating layer including the first insulating film arranged between the second oxide semiconductor layer and a substrate.

15 Claims, 26 Drawing Sheets

(58) Field of Classification Search
CPC ........... H01L 29/78618; H01L 29/7869; H01L 2227/323
See application file for complete search history.

(56) References Cited

U.S. PATENT DOCUMENTS

| | | |
|---|---|---|
| 2008/0225024 A1 | 9/2008 | Ito |
| 2011/0210355 A1* | 9/2011 | Yamazaki ............. H01L 27/124 438/23 |
| 2012/0138922 A1 | 6/2012 | Yamazaki et al. |
| 2013/0038518 A1 | 2/2013 | Tagawa et al. |
| 2013/0320334 A1 | 12/2013 | Yamazaki et al. |
| 2014/0286076 A1 | 9/2014 | Aoki et al. |
| 2017/0090229 A1 | 3/2017 | Imai et al. |
| 2020/0312934 A1* | 10/2020 | Bae .................... H01L 27/3248 |

FOREIGN PATENT DOCUMENTS

| | | |
|---|---|---|
| JP | 2012-134475 A | 7/2012 |
| JP | 2014-007399 A | 1/2014 |
| JP | 2014-209727 A | 11/2014 |
| JP | 2015-109315 A | 6/2015 |
| WO | 2011/118079 A1 | 9/2011 |
| WO | 2015/186619 A1 | 12/2015 |

* cited by examiner

ACTIVE MATRIX SUBSTRATE AND METHOD FOR MANUFACTURING SAME

CROSS-REFERENCE TO RELATED APPLICATIONS

This application claims the benefit of priority to Japanese Patent Application Number 2020-098520 filed on Jun. 5, 2020. The entire contents of the above-identified application are hereby incorporated by reference.

BACKGROUND

Technical Field

The disclosure relates to an active matrix substrate and a manufacturing method of the active matrix substrate.

An active matrix substrate used in a liquid crystal display device, an organic electroluminescence (EL) display device, or the like includes a display region including a plurality of pixels, and a region other than the display region (a non-display region or a frame region). The display region includes a switching element such as a Thin Film Transistor (hereinafter referred to as a "TFT") for each of the pixels. As such a switching element, a TFT including an amorphous silicon film serving as an active layer (hereinafter referred to as an "amorphous silicon TFT") and a TFT including a polycrystalline silicon film serving as an active layer (hereinafter referred to as a "polycrystalline silicon TFT") have been widely used in the related art.

Use of an oxide semiconductor as a material of the active layer of the TFT, in place of amorphous silicon and polycrystalline silicon, has been proposed. Such a TFT is referred to as an "oxide semiconductor TFT". The oxide semiconductor has a higher mobility than amorphous silicon. Thus, the oxide semiconductor TFT can operate at a higher speed than the amorphous silicon TFT.

A structure of the TFT is roughly classified into a bottom gate structure and a top gate structure. Currently, the bottom gate structure is often adopted for the oxide semiconductor TFT, but it is also proposed to use the top gate structure (see, for example, JP 2015-109315 A). In the top gate structure, the gate insulating layer can be thinned, resulting in high current supply performance.

In the non-display region of the active matrix substrate, peripheral circuits such as a drive circuit may be monolithically (integrally) formed. By forming the drive circuit monolithically, the non-display region is narrowed and the mounting process is simplified, resulting in cost reduction. For example, in the non-display region, the gate driver circuit may be formed monolithically, and the source driver circuit may be mounted by a chip on glass (COG) process.

In devices such as smartphones, where there is a high demand for narrowing the frame, in addition to the gate driver, a demultiplexer circuit such as a source shared driving (SSD) circuit may be formed monolithically. The SSD circuit is a circuit that distributes video data from one video signal line connected to each terminal of the source driver to a plurality of source wiring lines. By mounting the SSD circuit, the region in which the terminal portions and the wiring lines are arranged in the non-display region (terminal portion and wiring line formation region) can be further narrowed. Additionally, the number of outputs from the source driver can be reduced and the circuit size can be reduced, thereby reducing the cost of the driver IC.

Peripheral circuits such as a drive circuit, an SSD circuit and the like include TFTs. In this description, a TFT arranged in each pixel in the display region is referred to as a "pixel TFT", and a TFT configuring the peripheral circuit is referred to as a "circuit TFT". Further, among the circuit TFTs, a TFT configuring the drive circuit is referred to as a "drive circuit TFT", and a TFT configuring the SSD circuit is referred to as an "SSD circuit TFT".

In an active matrix substrate using an oxide semiconductor TFT as the pixel TFT, from the perspective of the manufacturing process, it is preferable that the circuit TFT be also formed by using the same oxide semiconductor film as the pixel TFT and by using a common process. Therefore, the circuit TFT and the pixel TFT usually have the same structure. The characteristics of these TFTs are also substantially the same.

SUMMARY

However, the characteristics required for the pixel TFT and the circuit TFT are different from each other. Further, among the circuit TFTs, for example, the drive circuit TFT and the SSD circuit TFT have different required characteristics. In recent years, the types of peripheral circuits formed monolithically in the active matrix substrate have been increasing, which further diversifies the performance required for the circuit TFTs.

Further, in an organic EL display device, a pixel circuit including at least two types of pixel TFTs (referred to as a "drive TFT" and a "selection TFT") and a capacitance element is provided in one pixel. The selection TFT has a function of selecting a pixel by changing the voltage applied to the drive TFT. The drive TFT functions to supply a current required for light emission. Since the selection TFT and the drive TFT have different functions, the characteristics required for the selection TFT and the drive TFT may also be different.

As described above, in an active matrix substrate provided with a plurality of TFTs having different uses, it is necessary to separately produce a plurality of oxide semiconductor TFTs having different characteristics so that each TFT can have the required characteristics according to the use.

An embodiment of the present disclosure has been conceived in light of the above-described circumstances, and an object of the present disclosure is to provide an active matrix substrate having a top gate structure and including a plurality of oxide semiconductor TFTs having different characteristics from one another.

An active matrix substrate and a manufacturing method of an active matrix substrate are disclosed herein in the following items.

Item 1

An active matrix substrate including a substrate and a plurality of oxide semiconductor TFTs including a first TFT and a second TFT supported on the substrate, in which the first TFT includes a first oxide semiconductor layer, a first gate electrode arranged on a part of the first oxide semiconductor layer with a first gate insulating layer interposed between the first oxide semiconductor layer and the first gate electrode, and a first source electrode and a first drain electrode electrically connected to the first oxide semiconductor layer, the first gate insulating layer has a layered structure including a first insulating film and a second insulating film arranged on the first insulating film, the second TFT includes a second oxide semiconductor layer having a higher mobility than the first oxide semiconductor layer, a second gate electrode arranged on a part of the second oxide semiconductor layer with a second gate insulating layer interposed between the second oxide semiconductor layer and the second gate electrode, and a second source electrode and a second drain electrode electrically connected to the second oxide semiconductor layer, and the second gate insulating layer includes the second insulating film and does not include the first insulating film, and the active matrix substrate further including a lower insulating layer including the first insulating film arranged between the second oxide semiconductor layer and the substrate.

Item 2

The active matrix substrate according to item 1, in which a side surface of the second oxide semiconductor layer and a side surface of the lower insulating layer are aligned with each other.

Item 3

The active matrix substrate according to item 1 or 2, in which a side surface of the first gate insulating layer and a side surface of the first gate electrode are aligned with each other, and a side surface of the second gate insulating layer and a side surface of the second gate electrode are aligned with each other.

Item 4

The active matrix substrate according to any one of items 1 to 3, in which the first insulating film and the second insulating film are both silicon oxide films.

Item 5

The active matrix substrate according to any one of items 1 to 4, in which the first TFT further includes a first conductive layer arranged on the substrate side of the first oxide semiconductor layer with a third insulating film interposed between the first oxide semiconductor layer and the first conductive layer, and when viewed from a normal direction of the substrate, the first conductive layer at least partially overlaps the first oxide semiconductor layer, and the second TFT further includes a second conductive layer arranged on the substrate side of the lower insulating layer with the third insulating film interposed between the lower insulating layer and the second conductive layer, and when viewed from the normal direction of the substrate, the second conductive layer at least partially overlaps the second oxide semiconductor layer.

Item 6

The active matrix substrate according to any one of items 1 to 5, having a display region that includes a plurality of pixel areas and a non-display region arranged around the display region, the active matrix substrate further including a plurality of pixel TFTs each arranged in the plurality of pixel areas, and a peripheral circuit arranged in the non-display region, in which each of the plurality of pixel TFTs is the first TFT and the peripheral circuit includes the second TFT.

Item 7

The active matrix substrate according to any one of items 1 to 5, having a display region that includes a plurality of pixel areas and a non-display region arranged around the display region, the active matrix substrate further including a gate drive circuit and an SSD circuit arranged in the non-display region, in which the gate drive circuit includes the first TFT, and the SSD circuit includes the second TFT.

Item 8

The active matrix substrate according to any one of items 1 to 5, having a display region that includes a plurality of pixel areas and a non-display region arranged around the display region, in which each of the plurality of pixel areas includes a pixel circuit including a selection TFT, a drive TFT, and a capacitance element, the drive TFT is the first TFT, and the selection TFT is the second TFT.

Item 9

The active matrix substrate according to any one of items 1 to 5, having a display region that includes a plurality of pixel areas and a non-display region arranged around the display region, the active matrix substrate further including a plurality of pixel circuits, each of the plurality of pixel circuits being arranged in each of the plurality of pixel areas and including a selection TFT, a drive TFT, and a capacitance element, and a gate drive circuit arranged in the non-display region, in which the drive TFT is the first TFT, and the gate drive circuit includes the second TFT.

Item 10

The active matrix substrate according to any one of items 1 to 9, the active matrix substrate further including an interlayer insulating layer covering the first oxide semiconductor layer, the first gate electrode, the second oxide semiconductor layer, and the second gate electrode, in which the first source electrode, the first drain electrode, the second source electrode, and the second drain electrode are arranged on the interlayer insulating layer.

Item 11

The active matrix substrate according to any one of items 1 to 9, the active matrix substrate further including an interlayer insulating layer covering the first oxide semiconductor layer, the first gate electrode, the second oxide semiconductor layer, and the second gate electrode, in which the first drain electrode, the second source electrode, and the second drain electrode are arranged on the interlayer insulating layer, and the first source electrode is arranged on the substrate side of the first oxide semiconductor layer with a third insulating film interposed between the first oxide semiconductor layer and the first source electrode.

Item 12

The active matrix substrate according to any one of items 1 to 11, in which the first oxide semiconductor layer and the second oxide semiconductor layer each contain In and/or Sn, and a sum of atomic ratios of In and Sn to all metal elements in the first oxide semiconductor layer is smaller than a sum of atomic ratios of In and Sn to all metal elements in the second oxide semiconductor layer.

Item 13

The active matrix substrate according to any one of items 1 to 11, in which both the first oxide semiconductor layer and the second oxide semiconductor layer contain an In—Ga—Zn—O based semiconductor, and an atomic ratio of In to all metal elements in the first oxide semiconductor layer is smaller than an atomic ratio of In to all metal elements in the second oxide semiconductor layer.

Item 14

The active matrix substrate according to item 13, in which the In—Ga—Zn—O based semiconductor in the first oxide semiconductor layer and/or the second oxide semiconductor layer contains a crystalline portion.

Item 15

A manufacturing method of an active matrix substrate including a plurality of oxide semiconductor TFTs, in which the plurality of oxide semiconductor TFTs includes a first TFT formed in a first TFT formation region and a second TFT formed in a second TFT formation region, the manufacturing method including (A) a step of forming a first oxide semiconductor film on a substrate in each of the first TFT formation region and the second TFT formation region, (B) a step of forming a first oxide semiconductor layer to be an active layer of the first TFT in the first TFT formation region, and removing the first oxide semiconductor film in the second TFT formation region by patterning the first oxide semiconductor film, (C) a step of forming a first insulating film in each of the first TFT formation region and the second TFT formation region, in which the first insulating film covers the first oxide semiconductor layer, (D) a step of forming a second oxide semiconductor film having a higher mobility than the first oxide semiconductor film on the first insulating film in each of the first TFT formation region and the second TFT formation region, (E) a step of removing the second oxide semiconductor film in the first TFT formation region, and forming a second oxide semiconductor layer to be an active layer of the second TFT in the second TFT formation region by patterning the second oxide semiconductor film, (F) a step of forming a second insulating film in each of the first TFT formation region and the second TFT formation region, in which the second insulating film covers the second oxide semiconductor layer and the first insulating film, (G) a step of forming a first gate electrode in the first TFT formation region and a second gate electrode in the second TFT formation region by forming a first conductive film on the second insulating film and patterning the first conductive film by using a resist mask in which, when viewed from a normal direction of the substrate, the first gate electrode overlaps a part of the first oxide semiconductor layer, and the second gate electrode overlaps a part of the second oxide semiconductor layer, and (H) a step of patterning the first insulating film and the second insulating film, in which, in the first TFT formation region, a first gate insulating layer having a layered structure including the first insulating film and the second insulating film is formed between the first gate electrode and the first oxide semiconductor layer by patterning the first insulating film and the second insulating film by using the resist mask or the first gate electrode as a mask, and in the second TFT formation region, a second gate insulating layer including the second insulating film is formed between the second gate electrode and the second oxide semiconductor layer by patterning the second insulating film by using the resist mask or the second gate electrode as a mask, and a lower insulating layer including the first insulating film is formed between the second oxide semiconductor layer and the substrate by patterning the first insulating film by using the second oxide semiconductor layer as a mask.

According to an embodiment of the disclosure, an active matrix substrate having a top gate structure and including a plurality of oxide semiconductor TFTs having different characteristics is provided. Further, according to the embodiment of the disclosure, provided is a manufacturing method of an active matrix substrate capable of producing a plurality of oxide semiconductor TFTs having different characteristics.

BRIEF DESCRIPTION OF DRAWINGS

The disclosure will be described with reference to the accompanying drawings, wherein like numbers reference like elements.

DESCRIPTION OF EMBODIMENTS

Figure 1:
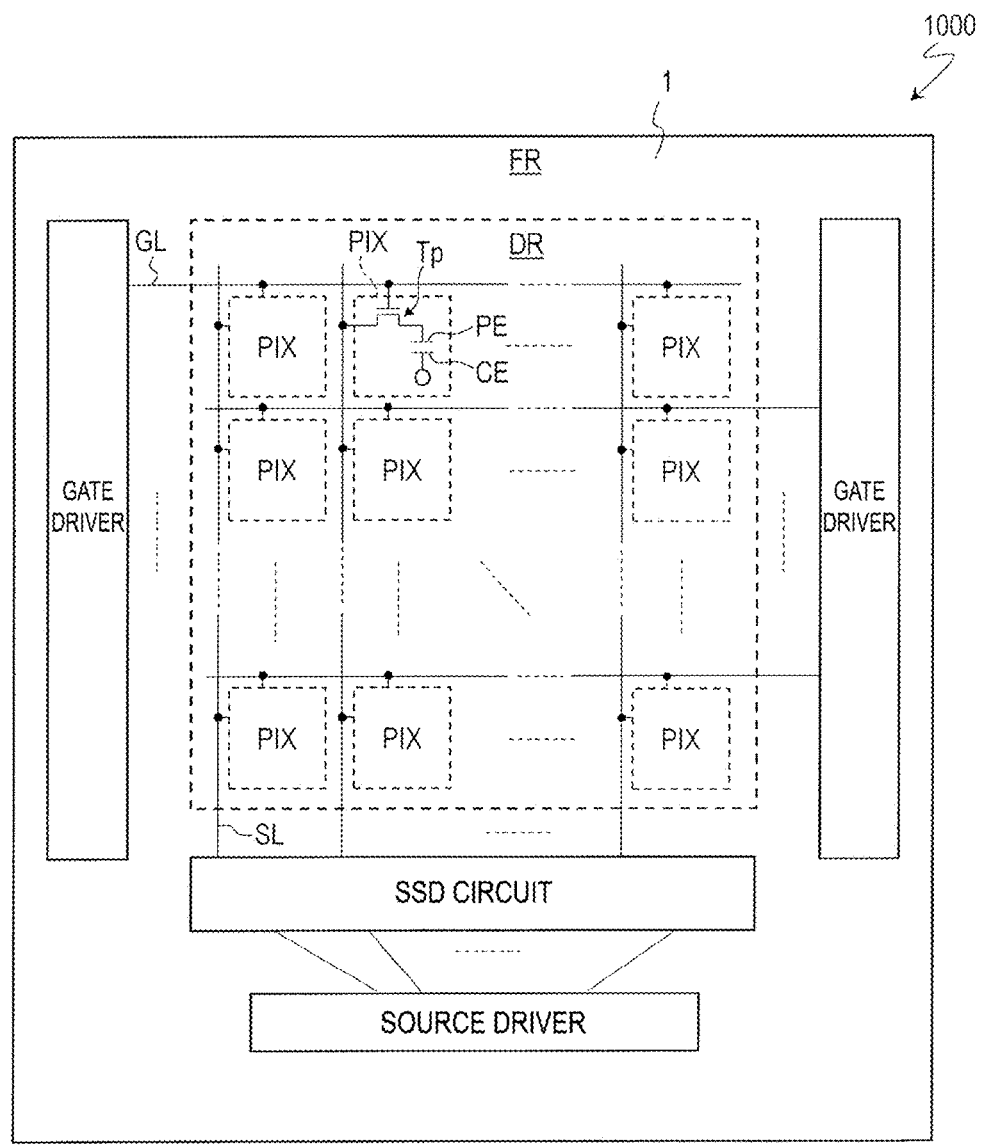
FIG. 1 is a schematic diagram illustrating an example of a planar structure of an active matrix substrate 1000 according to a first embodiment.

As described above, the TFTs provided in the active matrix substrate have different required characteristics depending on the respective uses. An example of suitable TFT characteristics will be described below.

An SSD circuit TFT used in an SSD circuit is required to flow a relatively large on current and have a large current driving force. With a TFT having a small current driving force, it may be difficult to charge the source bus line at a predetermined time. On the other hand, when the channel width of the TFT is increased in order to ensure the desired current driving force, the size of the TFT may increase, and the frame narrowing may not be achieved. Therefore, in the SSD circuit TFT, it is preferable to lower the threshold voltage to further increase the on current. The SSD circuit TFT may have, for example, depletion characteristics of having a negative threshold voltage.

In contrast, in a drive circuit TFT used in a drive circuit such as a gate driver, it is preferable that the threshold voltage be shifted in a positive direction from the threshold voltage of the SSD circuit TFT to reduce the off-leak current.

A large off-leak current may result in increased power consumption, operation failure or malfunction of the drive circuit, or the like. The drive circuit TFT may have, for example, enhancement characteristics of having a positive threshold voltage.

Additionally, a TFT having a small off-leak current is preferably used as a pixel TFT used in a liquid crystal display device. The pixel TFT may have depletion characteristics or enhancement characteristics.

However, it is difficult to form a plurality of TFTs with different characteristics by using the same oxide semiconductor film. For example, it is preferable to use an oxide semiconductor having a high mobility for the SSD circuit TFT, but when the mobility of the oxide semiconductor increases, the threshold voltage of the TFT tends to shift in a negative direction, resulting in depletion characteristics. Therefore, the oxide semiconductor having the high mobility may not be suitable for the drive circuit TFT. On the other hand, in order to obtain enhancement characteristics, an oxide semiconductor having a relatively low mobility is preferably used for the drive circuit TFT. However, since it is difficult to further increase the on current with the TFT having enhancement characteristics, it may not be suitable for other peripheral circuits such as, for example, the SSD circuit.

Further, in an organic EL display device, a pixel circuit including at least a drive TFT and a selection TFT is provided in one pixel. In order to suitably perform multi-gray scale display in the organic EL display device, it is preferable that the Vg-Id (Vg represents a gate voltage and Id represents a drain current) characteristic of the drive TFT be gentle (that is, not steep) to some extent. Therefore, the drive TFT is required to have a smaller slope of the sub-threshold characteristic, that is, a larger subthreshold coefficient (S value) than the selection TFT and the drive circuit TFT. On the other hand, the selection TFT may not be required to have the large S value. Rather, the selection TFT is required to have a small S value and a high switching speed.

Note that the uses and required characteristics of the TFT are not limited to the examples described above, and diversify.

Based on the knowledge described above, the inventors have found a method for producing a plurality of top gate TFTs having different characteristics from one another in an active matrix substrate used for display devices such as liquid crystal display devices, organic EL display devices and the like.

First Embodiment

Hereinafter, an active matrix substrate according to a first embodiment will be described with reference to the drawings. The active matrix substrate according to the present embodiment is used, for example, for a liquid crystal display device.

Basic Configuration of Active Matrix Substrate 1000

FIG. 1 is a schematic diagram illustrating an example of a planar structure of an active matrix substrate 1000 according to the present embodiment.

The active matrix substrate 1000 has a display region DR, and a region (a non-display region or a frame region) FR other than the display region DR. The display region DR is constituted of a plurality of pixel areas PIX arranged in a matrix shape. Each of the plurality of pixel areas PIX (also referred to as a "pixel") is an area corresponding to a pixel of the display device. The non-display region FR is a region positioned in a periphery of the display region DR and does not contribute to display.

In the non-display region FR, for example, a gate driver, a demultiplexer circuit functioning as an SSD circuit, and the like are monolithically provided on a substrate 1. A source driver is mounted on the active matrix substrate 1000, for example.

In the display region DR, a plurality of gate bus lines GL extending in a row direction (x direction), and a plurality of source bus lines SL extending in a column direction (y direction) are formed. Each of the plurality of pixel areas PIX is defined by the gate bus line GL and the source bus line SL, for example. The gate bus lines GL are connected to respective terminals of the gate driver. The source bus lines SL are connected to respective terminals of the source driver.

Each of the plurality of pixel areas PIX includes a thin film transistor Tp and a pixel electrode PE. The thin film transistor Tp is also referred to as a "pixel TFT". A gate electrode of the thin film transistor Tp is electrically connected to the corresponding gate bus line GL, and a source electrode of the thin film transistor Tp is electrically connected to the corresponding source bus line SL. A drain electrode of the thin film transistor Tp is electrically connected to the pixel electrode PE. When the active matrix substrate 1000 is applied to a display device in a transverse electrical field mode such as a fringe field switching (FFS) mode, although not illustrated, the active matrix substrate 1000 is provided with an electrode common to the plurality of pixels (common electrode).

A plurality of circuit TFTs configuring the peripheral circuits are formed in the non-display region of the active matrix substrate 1000. The circuit TFT includes a drive circuit TFT configuring the gate driver, an SSD circuit TFT configuring the SSD circuit, and the like.

TFT Structure in Active Matrix Substrate 1000

Next, the structures of the plurality of top gate TFTs included in the active matrix substrate 1000 will be described.

In the present embodiment, the active matrix substrate 1000 includes a plurality of oxide semiconductor TFTs having a top gate structure. At least one first TFT and one second TFT are included in the plurality of oxide semiconductor TFTs.

A first oxide semiconductor layer, which is an active layer of the first TFT, is formed of a first oxide semiconductor film OS1, and a second oxide semiconductor layer, which is an active layer of the second TFT, is formed of a second oxide semiconductor film OS2. In other words, the first oxide semiconductor layer and the second oxide semiconductor layer are different layers from each other.

Figure 2:
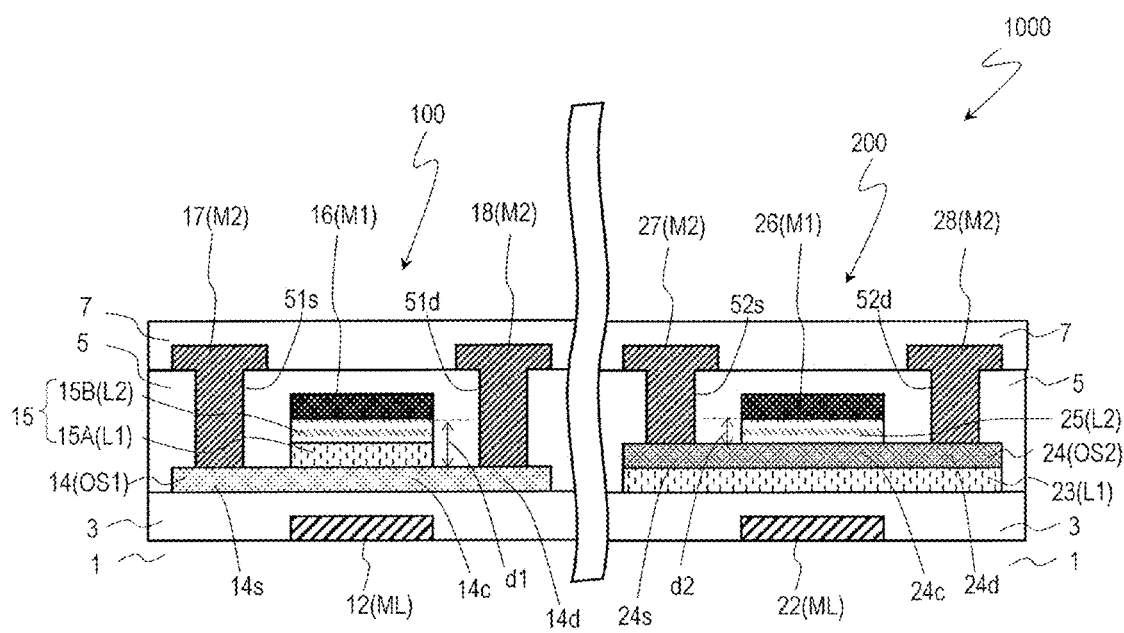
FIG. 2 is a cross-sectional view illustrating a first TFT 100 and a second TFT 200 in the active matrix substrate 1000.

FIG. 2 is a cross-sectional view illustrating a first TFT 100 and a second TFT 200 formed in the active matrix substrate 1000. The first TFT 100 may be a pixel TFT, and the second TFT 200 may be a circuit TFT (for example, a drive circuit TFT). The active matrix substrate 1000 may have a plurality of first TFTs 100 and a plurality of second TFTs 200, but here, only a single first TFT 100 and a single second TFT 200 are illustrated and described.

First, a layer structure of the active matrix substrate 1000 will be described. The active matrix substrate 1000 includes a lower metal layer ML, a base insulating film 3, the first oxide semiconductor film OS1, a first insulating film L1, the second oxide semiconductor film OS2, a second insulating film L2, a first metal layer M1, an interlayer insulating layer 5, and a second metal layer M2 in this order from the substrate 1 side. Accordingly, the first oxide semiconductor film OS1 is positioned lower than the second oxide semiconductor film OS2.

The "lower metal layer ML" is a layer including electrodes, wiring lines, and the like formed of a lower conductive film, and includes, for example, light blocking layers of the respective TFTs. The "first metal layer M1" is a layer including electrodes, wiring lines, and the like formed of a first conductive film, and includes, for example, the gate bus line GL, gate electrodes of the respective TFTs, and the like. The "second metal layer M2" is a layer including electrodes, wiring lines, and the like formed of a second conductive film, and includes, for example, the source bus line SL, source and drain electrodes of the respective TFTs, and the like.

In the drawings, a reference sign for each constituent element may be followed by a sign indicating the metal layer, the insulating film, or the semiconductor film in parenthesis. For example, "(M1)" may be added after the reference sign of the electrode or wiring line formed in the first metal layer M1.

Next, a TFT structure will be described. Each of the first TFT 100 and second TFT 200 is the oxide semiconductor TFT that is supported on the substrate 1 and has a top gate structure.

The first TFT 100 includes a first oxide semiconductor layer 14 formed of the first oxide semiconductor film OS1, a first gate electrode 16 arranged on a part of the first oxide semiconductor layer 14 with a first gate insulating layer 15 interposed therebetween, and a first source electrode 17 and a first drain electrode 18 that are electrically connected to the first oxide semiconductor layer 14.

The first gate insulating layer 15 has a layered structure including a lower layer 15A formed of the first insulating film L1 and an upper layer 15B formed of the second insulating film L2 arranged on the first insulating film L1. A side surface of the lower layer 15A and a side surface of the upper layer 15B may be aligned. Here, a structure that "aligns side surfaces" of two layers includes a structure obtained when the two layers are etched using the same resist mask, or when one is used as a mask to etch another.

The first oxide semiconductor layer 14 has a first region 14c covered with the first gate electrode 16 with the first gate insulating layer 15 interposed therebetween, and a second region not covered with the first gate electrode 16 when viewed from a normal direction of the substrate 1. The second region may be a low-resistance region having a lower specific resistance than the first region 14c. The low-resistance region can be formed, for example, by subjecting the first oxide semiconductor layer 14 to processing for lowering the resistance using the first gate electrode 16 as a mask.

The second region (low-resistance region) has a source contact region 14s and a drain contact region 14d so as to sandwich the first region 14c when viewed from the normal direction of the substrate 1. The source contact region 14s is a region electrically connected to the first source electrode 17, and the drain contact region 14d is a region electrically connected to the first drain electrode 18.

The first gate insulating layer 15 may cover the first region 14c and may not cover the source contact region 14s and the drain contact region 14d. In the illustrated example, the first gate insulating layer 15 is formed only in a region overlapping the first gate electrode 16 when viewed from the normal direction of the substrate 1. The side surface of a first gate insulating layer 15 and a side surface of the first gate electrode 16 may be aligned with each other.

When viewed from the normal direction of the substrate 1, the first gate electrode 16 is arranged on the first gate insulating layer 15 so as to overlap the first region 14c and not to overlap the source contact region 14s and the drain contact region 14d.

The first TFT 100 may include a first conductive layer 12 that functions as a light blocking layer on the substrate 1 side of the first oxide semiconductor layer 14. The first conductive layer 12 is covered with the base insulating film 3. The first oxide semiconductor layer 14 is arranged on the base insulating film 3. The first conductive layer 12 may be arranged so as to overlap at least the first region 14c of the first oxide semiconductor layer 14 when viewed from the normal direction of the substrate 1. In this manner, characteristic deterioration of the first oxide semiconductor layer 14 caused by light from the substrate 1 side (backlight) can be suppressed. The first conductive layer 12 may be electrically in a floating state or may be fixed to the GND potential (0 V). Alternatively, the first conductive layer 12 may function as a lower gate electrode by being electrically connected to the first gate electrode 16 by a connection section (not illustrated).

On the other hand, the second TFT 200 includes a second oxide semiconductor layer 24 formed of the second oxide semiconductor film OS2, a second gate electrode 26 arranged on a part of the second oxide semiconductor layer 24 with a second gate insulating layer 25 interposed therebetween, and a second source electrode 27 and a second drain electrode 28 that are electrically connected to the second oxide semiconductor layer 24. The second oxide semiconductor layer 24 has a higher mobility than the first oxide semiconductor layer 14.

The second gate insulating layer 25 includes the second insulating film L2, but does not include the first insulating film L1. A side surface of the second gate insulating layer 25 and a side surface of the second gate electrode 26 may be aligned with each other.

A lower insulating layer 23 is arranged between the second oxide semiconductor layer 24 and the substrate 1. The lower insulating layer 23 is formed of the first insulating film L1. In other words, the lower insulating layer 23 is the same layer as the lower layer 15A in the first gate insulating layer 15 of the first TFT 100. A side surface of the second oxide semiconductor layer 24 and a side surface of the lower insulating layer 23 may be aligned with each other.

Similar to the first oxide semiconductor layer 14, the second oxide semiconductor layer 24 has a first region 24c covered with the second gate electrode 26 with the second gate insulating layer 25 interposed therebetween, and a second region (low-resistance region) not covered with the second gate electrode 26 when viewed from the normal direction of the substrate 1. The second region has a source contact region 24s and a drain contact region 24d so as to sandwich the first region 24c when viewed from the normal direction of the substrate 1. The source contact region 24s is a region electrically connected to the second source electrode 27, and the drain contact region 24d is a region electrically connected to the second drain electrode 28.

The second gate insulating layer 25 may cover the first region 24c and may not cover the source contact region 24s and the drain contact region 24d. In the illustrated example, the second gate insulating layer 25 is formed only in a region overlapping the second gate electrode 26 when viewed from the normal direction of the substrate 1. A side surface of the second gate insulating layer 25 and a side surface of the second gate electrode 26 may be aligned with each other.

When viewed from the normal direction of the substrate 1, the second gate electrode 26 is arranged on the second gate insulating layer 25 so as to overlap the first region 24c and not to overlap the source contact region 24s and the drain contact region 24d. The second gate electrode 26 is formed, for example, by using the same conductive film (first conductive film) as the first gate electrode 16 of the first TFT 100 (that is, in the first metal layer M1).

The second TFT 200, similar to the first TFT 100, may have a second conductive layer 22 that functions as a light blocking layer on the substrate 1 side of the second oxide semiconductor layer 24. The second conductive layer 22 is formed, for example, by using the same conductive film (lower conductive film) as the first conductive layer 12 of the first TFT 100 (that is, in the lower metal layer ML). The second conductive layer 22 is covered with the base insulating film 3, and the lower insulating layer 23 and the second oxide semiconductor layer 24 are arranged in this order on the base insulating film 3. The second conductive layer 22 may be arranged so as to overlap at least the first region 24c of the second oxide semiconductor layer 24 when viewed from the normal direction of the substrate 1. The second conductive layer 22 may be electrically in a floating state or may be fixed to the GND potential (0 V). Alternatively, the second conductive layer 22 may function as a lower gate electrode by being electrically connected to the second gate electrode 26.

The interlayer insulating layer 5 is arranged so as to cover the first oxide semiconductor layer 14, the first gate insulating layer 15, and the first gate electrode 16 of the first TFT 100, and the second oxide semiconductor layer 24, the second gate insulating layer 25, and the second gate electrode 26 of the second TFT 200. The interlayer insulating layer 5 may be in directly contact with a part of the second region of the first oxide semiconductor layer 14 and a part of the second region of the second oxide semiconductor layer 24.

The first source electrode 17 and the first drain electrode 18 of the first TFT 100, and the second source electrode 27 and the second drain electrode 28 of the second TFT 200 are arranged on, for example, the interlayer insulating layer 5. These electrodes may be formed by using the same conductive film (second conductive film) (that is, in the second metal layer M2). In this example, the interlayer insulating layer 5 is provided with source openings 51s and 52s that expose the source contact regions 14s and 24s, and drain openings 51d and 52d that expose the drain contact regions 14d and 24d, of the first oxide semiconductor layer 14 and the second oxide semiconductor layer 24. The first source electrode 17 is arranged on the interlayer insulating layer 5 and in the source opening 51s, and is connected to the source contact region 14s in the source opening 51s. The first drain electrode 18 is arranged on the interlayer insulating layer 5 and in the drain opening 51d, and is connected to the drain contact region 14d in the drain opening 51d. Similarly, the second source electrode 27 is arranged on the interlayer insulating layer 5 and in the source opening 52s, and is connected to the source contact region 24s in the source opening 52s. The second drain electrode 28 is arranged on the interlayer insulating layer 5 and in the drain opening 52d, and is connected to the drain contact region 24d in the drain opening 52d.

An inorganic insulating layer 7 is formed on the first TFT 100 and the second TFT 200 so as to cover the first source electrode 17, the first drain electrode 18, the second source electrode 27, and the second drain electrode 28.

When the first TFT 100 is used as the thin film transistor Tp (pixel TFT) illustrated in FIG. 1, the first gate electrode 16 is electrically connected to the corresponding gate bus line GL. The first gate electrode 16 and the corresponding gate bus line GL may be integrally formed in the first metal layer M1 (that is, by using the first conductive film). The first source electrode 17 is electrically connected to the corresponding source bus line SL. The first source electrode 17 and the corresponding source bus line SL may be integrally formed in the second metal layer M2 (that is, by using the second conductive film). The first drain electrode 18 is electrically connected to the corresponding pixel electrode PE. The specific structure of the pixel TFT will be described later.

As described above, the electrodes, the insulating layers, and the semiconductor layers of the first TFT 100 and second TFT 200 have the following relationships.

(1) The first oxide semiconductor layer 14 and the second oxide semiconductor layer 24 are formed of different oxide semiconductor films and are different layers from each other.

(2) The lower layer 15A of the first gate insulating layer 15 and the lower insulating layer 23 are formed of the same insulating film (the first insulating film L1) and are the same layer.

(3) The upper layer 15B of the first gate insulating layer 15 and the second gate insulating layer 25 are formed of the same insulating film (the second insulating film L2) and are the same layer.

The electrodes of the first TFT 100 and the second TFT 200 may further have the following relationships.

(4) The first gate electrode 16 and the second gate electrode 26 are the same layer (first metal layer M1).

(5) The first source electrode 17, the first drain electrode 18, the second source electrode 27, and the second drain electrode 28 are the same layer (second metal layer M2).

(6) The first conductive layer 12 and the second conductive layer 22 are the same layer (lower metal layer ML).

According to the present embodiment, it is possible to produce two types of TFTs having different mobilities and gate insulating layer thicknesses on the same substrate. Since the first TFT 100 and the second TFT 200 utilize the common conductive films and insulating films, the first TFT 100 and the second TFT 200 may be manufactured by a common process.

In the present embodiment, the first oxide semiconductor layer 14, which is the active layer of the first TFT 100, and the second oxide semiconductor layer 24, which is the active layer of the second TFT 200, are formed of different oxide semiconductor films each other. As a result, the mobility and thickness of each oxide semiconductor film can be controlled independently. Therefore, the threshold voltage of each TFT can be controlled in accordance with the required characteristics.

In the present embodiment, the first oxide semiconductor layer 14 of the first TFT 100 has the lower mobility than the second oxide semiconductor layer 24 of the second TFT 200, so that the first TFT 100 has a larger threshold voltage than the second TFT in a positive direction. For example, the first TFT 100 may have enhanced characteristics that the threshold voltage is positive. The second TFT 200 may have enhancement characteristics or may have depletion characteristics that the threshold voltage is negative.

Further, according to the present embodiment, a thickness d1 of the first gate insulating layer 15 of the first TFT 100 can be made thicker than a thickness d2 of the second gate insulating layer 25 of the second TFT 200. The thickness d2 of the second gate insulating layer 25 of the second TFT 200 is determined by a thickness of the second insulating film L2, and the thickness d1 of the first gate insulating layer 15 of the first TFT 100 is determined by a total thickness of the first insulating film L1 and the second insulating film L2. Therefore, the thickness of the gate insulating layer of each TFT can be independently controlled according to the required characteristics by the thicknesses of the first insulating film L1 and the second insulating film L2.

In the second TFT 200, the second gate insulating layer 25 can be made thin, so that the current driving force can be further increased. In addition, by thinning the second gate insulating layer 25, the slope of the subthreshold characteristic can be steep (that is, the S value can be reduced), so that the switching characteristics can be improved. On the other hand, in the first TFT 100, a high breakdown voltage (gate breakdown voltage) performance can be obtained by thickening the first gate insulating layer 15. Also, the threshold voltage may be increased. As a result, the influence of foreign matters and the like can be reduced, which is effective for TFT arranged in a pixel that has a large area. Further, since the S value becomes large, the first TFT 100 can be suitably used for, for example, a pixel circuit of an organic EL display device, as will be described later.

Figure 3:
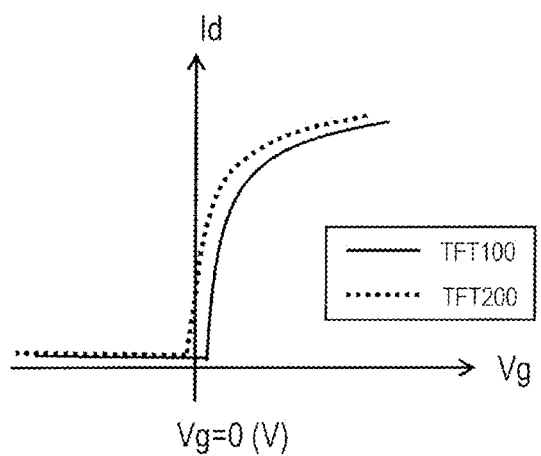
FIG. 3 is a diagram illustrating Vg-Id characteristics of the first TFT 100 and the second TFT 200 in the active matrix substrate 1000.

FIG. 3 is a diagram illustrating Vg-Id characteristics of the first TFT 100 and the second TFT 200. The horizontal axis of the graph represents the potential of the gate electrode based on the potential of the drain electrode (gate-drain voltage) Vg, and the vertical axis of the graph represents the drain current Id.

From FIG. 3, it can be seen that the threshold voltage of the first TFT 100 is shifted in the positive direction from the threshold voltage of the second TFT 200. It can also be seen that the on current of the first TFT 100 is smaller than the on current of the second TFT 200.

In this example, the first TFT 100 has enhancement characteristics that the threshold voltage is positive. The second TFT 200 has depletion characteristics that the threshold voltage is negative (that is, in the second TFT 200, the drain current Id flows when the gate-drain voltage Vg is 0 V). Note that the positive/negative and magnitude of the threshold voltage of each TFT are not limited to the illustrated example, and may be adjusted by the composition of the active layer or the like.

In FIG. 3, since the difference between the threshold voltages of the first TFT 100 and the second TFT 200 is small, there is little difference between the S value of the first TFT 100 and the S value of the second TFT 200. However, by further lowering the mobility of the first oxide semiconductor layer 14 of the first TFT 100, or by further increasing the total thickness of the first insulating film L1 and the second insulating film L2, the S value of the first TFT 100 may be increased (that is, the current-voltage characteristic may be made gentle).

In a liquid crystal display device, the first TFT 100 is suitably used as a pixel TFT because the off-leak current is small. Additionally, as illustrated in the figure, when the first TFT 100 has the enhancement characteristics, the first TFT 100 may be suitably used for some circuit TFTs such as a drive circuit TFT. As a result, circuit malfunction can be suppressed, thereby reducing yield loss. Further, the first TFT 100 may be used as an inspection TFT or an ESD protection TFT.

The second TFT 200 is suitably used for some circuit TFTs such as, for example, an SSD circuit TFT. The second TFT 200 has the higher mobility than the first TFT 100, and has a superior current driving force (on current). In addition, the channel can be shortened, thereby reducing a circuit area. Further, in the second TFT 200, the second gate insulating layer 25 can be made thin, so that the S value can be made small. Therefore, the second TFT 200 has excellent switching characteristics, whereby high-speed operation is possible.

As the drive circuit TFT, both the first TFT 100 and the second TFT 200 may be included. For example, among the plurality of TFTs included in the gate drive circuit, at least a TFT referred to as an "output transistor" may be the second TFT 200 having the high mobility, and the other TFTs may be the first TFTs 100.

Table 1 illustrates suitable characteristics of the pixel TFT, the drive circuit TFT, and the SSD circuit TFT in liquid crystal display devices. The characteristics and numerical ranges set forth in Table 1 are examples, and are not limited to the characteristics of each TFT.

TABLE 1

| Use of TFT | Pixel TFT | Drive circuit TFT | SSD circuit TFT Drive circuit TFT (output transistor) |
|---|---|---|---|
| Threshold voltage | Depletion to enhancement −1 V or more | Enhancement 0 V or more | Depletion is possible for SSD circuit TFT −2 V or more |
| Mobility | Low to medium 5 cm$^2$/Vs or more 20 cm$^2$/Vs or less | Low to medium 5 cm$^2$/Vs or more 20 cm$^2$/Vs or less | High 20 cm$^2$/Vs or more |
| TFT structure | First TFT | First TFT | Second TFT |

First Insulating Film L1 and Second Insulating Film L2

As the first insulating film L1 and the second insulating film L2, a silicon oxide (SiOx) layer, a silicon nitride (SiNx) layer, a silicon oxynitride (SiOxNy; x>y) layer, a silicon nitride oxide (SiNxOy; x>y) layer, or the like may be used as appropriate. The first insulating film L1 and the second insulating film L2 may each be a single layer or may each have a layered structure. The first insulating film L1 and the second insulating film L2 may each be a silicon oxide film. When an oxide film such as a silicon oxide film is used, oxidation deficiency generated in the channel regions of the first oxide semiconductor layer 14 and the second oxide semiconductor layer 24 can be reduced by the oxide film, so that, the resistance reduction of the channel region can be suppressed.

The thickness d2 of the second gate insulating layer 25 of the second TFT 200, that is, the thickness of the second insulating film L2 may be, for example, 50 nm or more and 150 nm or less. On the other hand, the thickness d1 of the first gate insulating layer 15 of the first TFT 100, that is, the total thickness of the first insulating film L1 and the second insulating film L2 may be, for example, 120 nm or more and 300 nm or less. The thickness of the first insulating film L1 is preferably set so that the etching solution for forming the second oxide semiconductor film OS2 does not soak into the entire thickness of the first insulating film L1 (the first insulating film L1 is not removed by the etching solution). The thickness of the second insulating film L2 may be determined by the minimum film thickness that can function as the insulating film for the second oxide semiconductor film OS2.

Note that the suitable thicknesses of the first insulating film L1 and the second insulating film L2 may vary depending on the use of each TFT, the materials of the first insulating film L1 and the second insulating film L2, the materials of the first oxide semiconductor layer 14 and the second oxide semiconductor layer 24, and the like.

First Oxide Semiconductor Film OS1 and Second Oxide Semiconductor Film OS2

The composition, crystal structure, thickness, forming method, and the like of the first oxide semiconductor film OS1 (first oxide semiconductor layer 14) and the second oxide semiconductor film OS2 (second oxide semiconductor layer 24) are not particularly limited. Further, the first oxide semiconductor film OS1 and/or the second oxide semiconductor film OS2 may be a single-layer film or a layered film including a plurality of oxide semiconductor films. The mobility of the first oxide semiconductor film OS1 (when the first oxide semiconductor film OS1 is a layered film, the mobility of the entire layered film) may be lower than the mobility of the second oxide semiconductor film OS2.

The compositions of the first oxide semiconductor film OS1 and the second oxide semiconductor film OS2 may be different from each other. "Having different compositions" means that each of the layers contains different types of metal elements or metal elements with different composition ratios. As an example, the first oxide semiconductor film OS1 and the second oxide semiconductor film OS2 include In and/or Sn, respectively, and a sum of atomic ratios of In and Sn to all metal elements in the first oxide semiconductor film OS1 may be smaller than a sum of atomic ratios of In and Sn to all metal elements in the second oxide semiconductor film OS2.

The first oxide semiconductor film OS1 and the second oxide semiconductor film OS2 may be both In—Ga—Zn—O based oxide semiconductor layer, and an atomic ratio of In in the first oxide semiconductor film OS1 may be smaller than an atomic ratio of In in the second oxide semiconductor film OS2. In this case, in one of the first oxide semiconductor film OS1 and the second oxide semiconductor film OS2, the atomic ratio of In to all metal elements and an atomic ratio of Zn to all metal elements may be the same.

Alternatively, the second oxide semiconductor film OS2 may contain Sn, and the first oxide semiconductor film OS1 may not contain Sn. Instead, the first oxide semiconductor film OS1 may contain Sn at a lower concentration than the second oxide semiconductor film OS2. In other words, the atomic ratio of Sn to all metal elements in the first oxide semiconductor film OS1 may be smaller than the atomic ratio of Sn to all metal elements in the second oxide semiconductor film OS2.

As the first oxide semiconductor film OS1, for example, an In—Ga—Zn—O based semiconductor film (e.g., In:Ga:Zn=1:1:1) can be used. As the second oxide semiconductor film OS2, for example, an In—Ga—Zn—O based semiconductor film (for example, In:Ga:Zn=3:1:2), an In—Sn—Zn—O based semiconductor film, an In—Al—Sn—Zn—O based semiconductor film, an In—W—Zn—O based semiconductor film, an In—Sn—O based semiconductor film, an In—Zn—O based semiconductor film, an In—Ga—Sn—O based semiconductor film, an In—Sn—Ti—Zn—O based semiconductor film, or the like can be used.

Further, the first oxide semiconductor film OS1 and the second oxide semiconductor film OS2 may have different crystal structures from each other. For example, one of the first oxide semiconductor film OS1 and the second oxide semiconductor film OS2 may be an amorphous oxide semiconductor film, and the other may be a crystalline oxide semiconductor film containing a crystalline portion.

Even when the ratio of each metal element of the first oxide semiconductor film OS1 and the ratio of each metal element of the second oxide semiconductor film OS2 are the same, the mobilities of these oxide semiconductor films can be made different from each other by changing the film formation method or the film formation conditions. For example, when forming an oxide semiconductor film having each of the same metal element ratios as the first oxide semiconductor film OS1 and the second oxide semiconductor film OS2 by sputtering, the atmosphere in the chamber (for example, the flow ratio of oxygen and Ar supplied to the chamber) may be different between these oxide semiconductor films. Specifically, when forming the first oxide semiconductor film OS1, the flow ratio of oxygen to Ar may be set to be large (for example, 80%), and when forming the second oxide semiconductor film OS2, the flow ratio of oxygen to Ar may be set smaller than the first oxide semiconductor film OS1 (for example, 20%). As a result, the mobility of the second oxide semiconductor film OS2 can be made higher than that of the first oxide semiconductor film OS1.

The thickness of each oxide semiconductor layer is not particularly limited, but, for example, the second oxide semiconductor film OS2 may be thinner than the first oxide semiconductor film OS1. By thinning the second oxide semiconductor film OS2, the threshold voltage of the second TFT 200 can be set near 0 V. As a result, the second TFT 200 with a high on current is obtained while having the enhancement characteristics. The thickness of the first oxide semiconductor film OS1 may be, for example, 20 nm or more and 100 nm or less. The thickness of the second oxide semiconductor film OS2 may be, for example, 5 nm or more and 20 nm or less.

Manufacturing Method of Active Matrix Substrate 1000

The first TFT 100 and second TFT 200 in the active matrix substrate 1000 may be manufactured, for example, by the following steps.

Figure 4A:
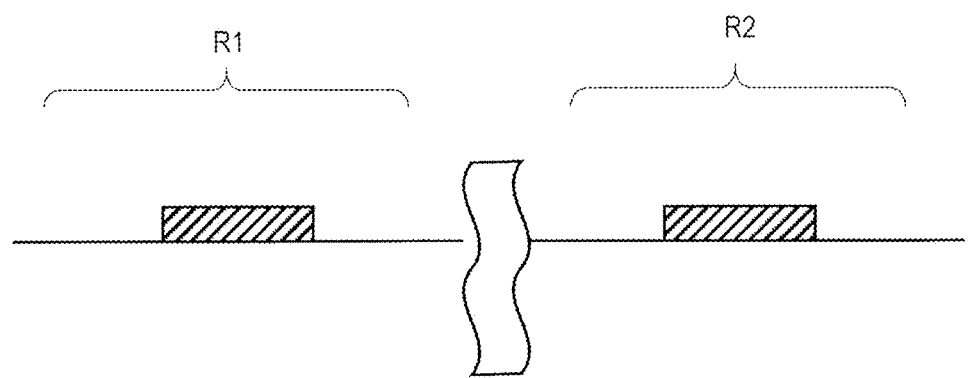
FIG. 4A is a process cross-sectional view illustrating a manufacturing method of the active matrix substrate 1000.
Figure 4B:
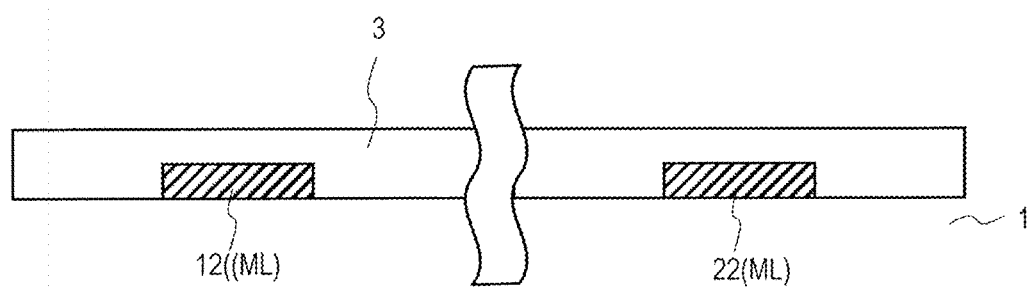
FIG. 4B is a process cross-sectional view illustrating the manufacturing method of the active matrix substrate 1000.
Figure 4C:
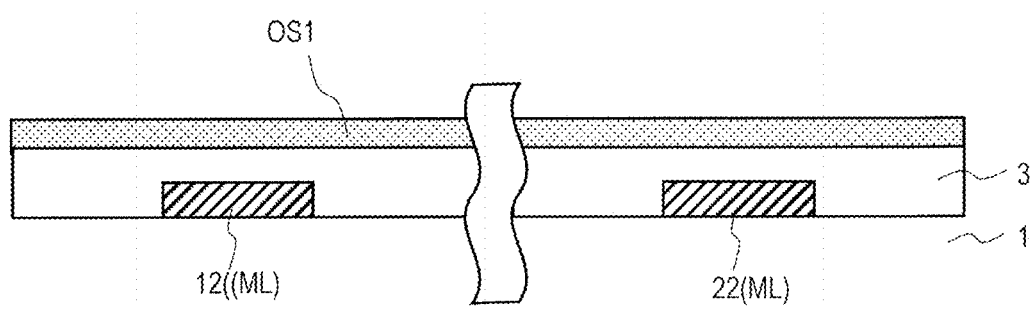
FIG. 4C is a process cross-sectional view illustrating the manufacturing method of the active matrix substrate 1000.
Figure 4D:
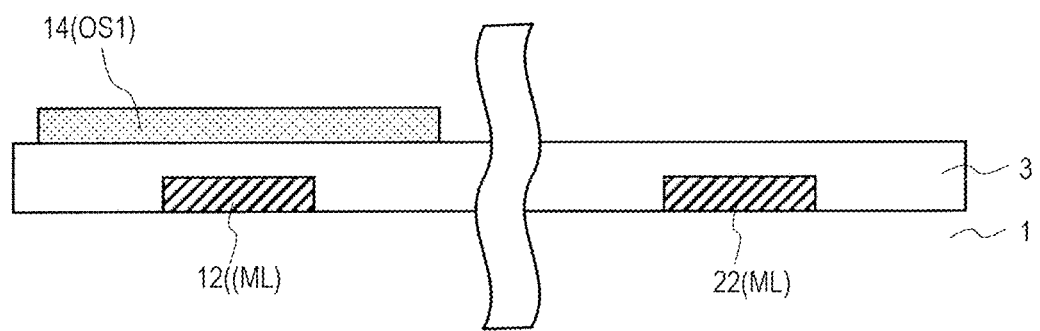
FIG. 4D is a process cross-sectional view illustrating the manufacturing method of the active matrix substrate 1000.
Figure 4E:
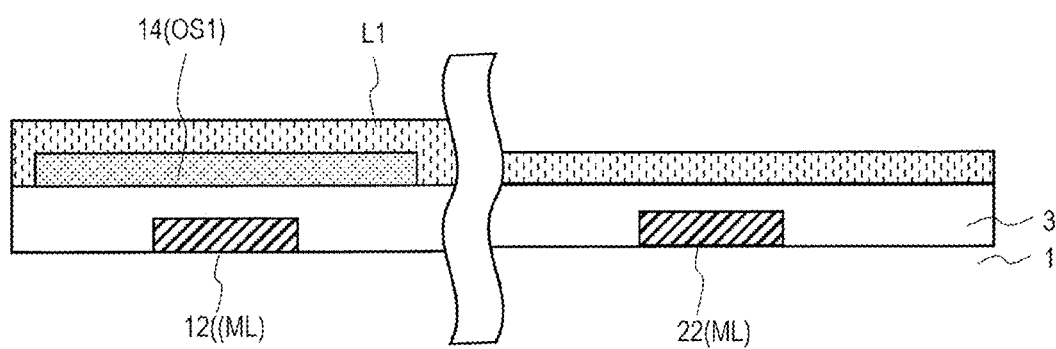
FIG. 4E is a process cross-sectional view illustrating the manufacturing method of the active matrix substrate 1000.
Figure 4F:
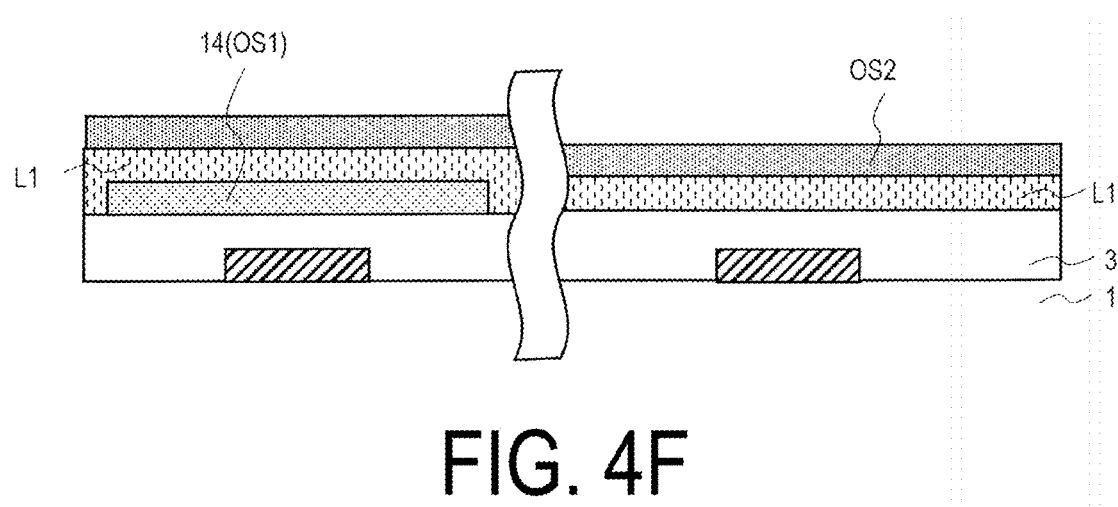
FIG. 4F is a process cross-sectional view illustrating the manufacturing method of the active matrix substrate 1000.
Figure 4G:
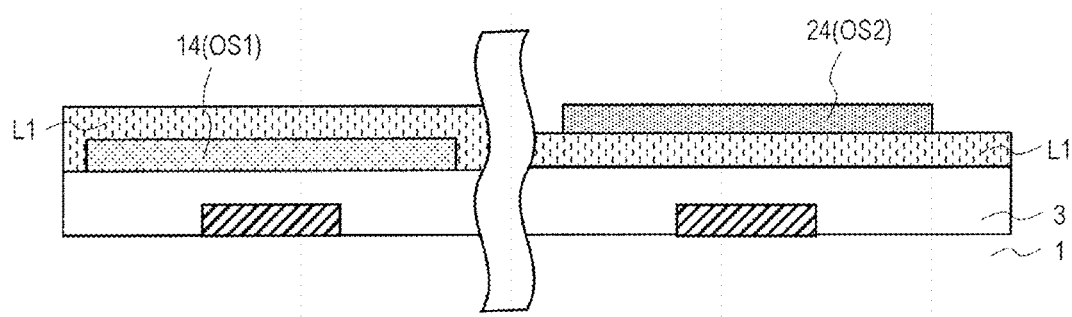
FIG. 4G is a process cross-sectional view illustrating the manufacturing method of the active matrix substrate 1000.
Figure 4H:
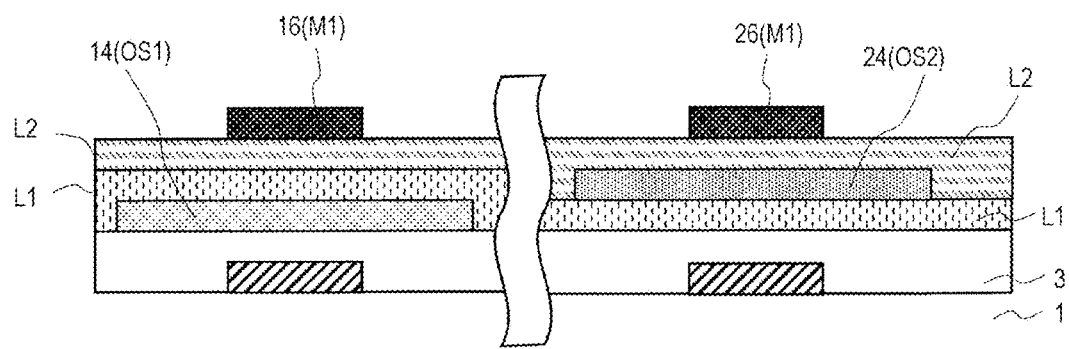
FIG. 4H is a process cross-sectional view illustrating the manufacturing method of the active matrix substrate 1000.
Figure 4I:
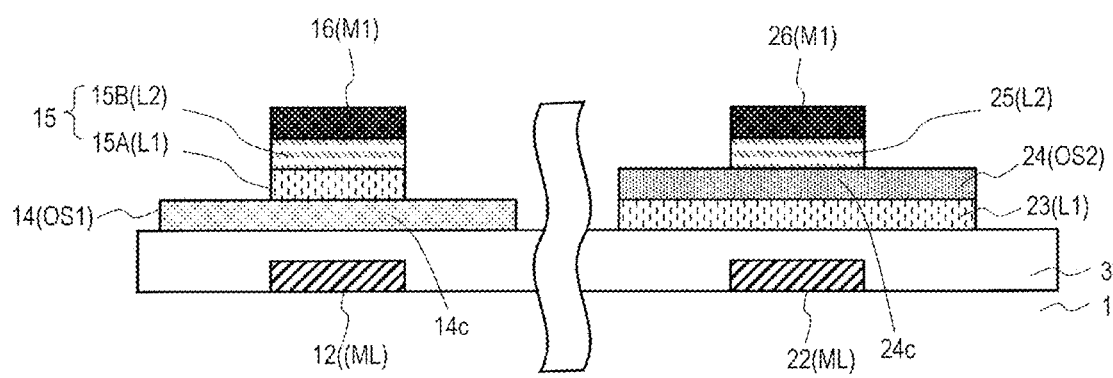
FIG. 4I is a process cross-sectional view illustrating the manufacturing method of the active matrix substrate 1000.
Figure 4J:
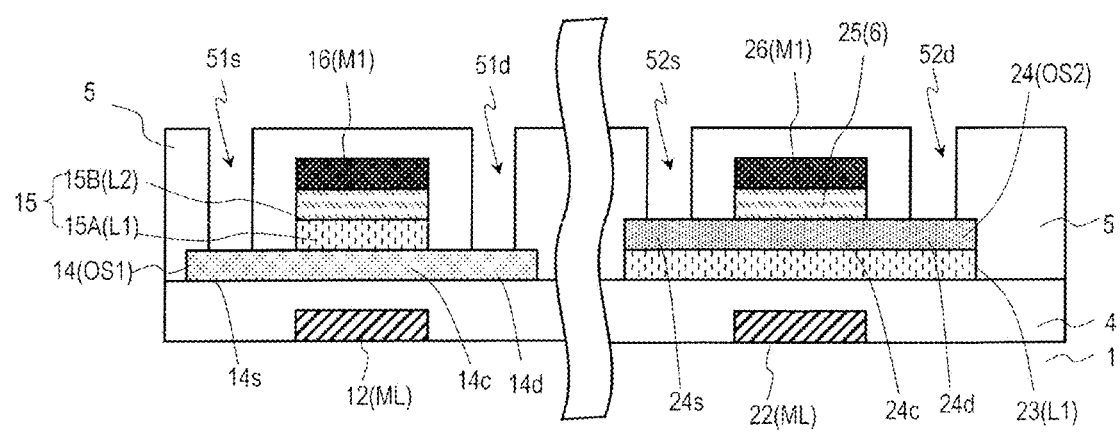
FIG. 4J is a process cross-sectional view illustrating the manufacturing method of the active matrix substrate 1000.
Figure 4K:
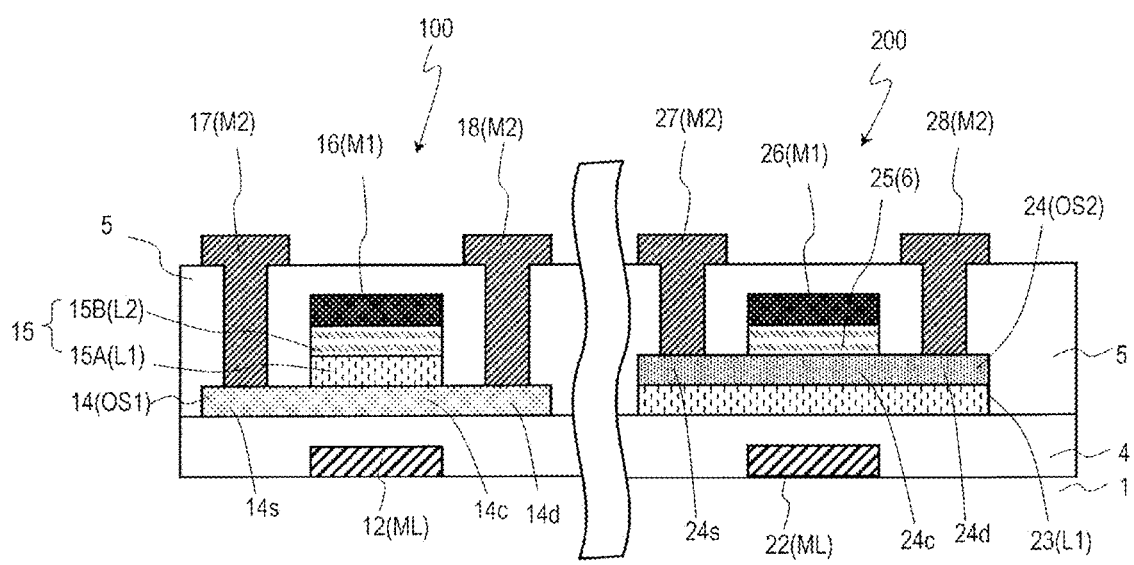
FIG. 4K is a process cross-sectional view illustrating the manufacturing method of the active matrix substrate 1000.
Figure 4L:
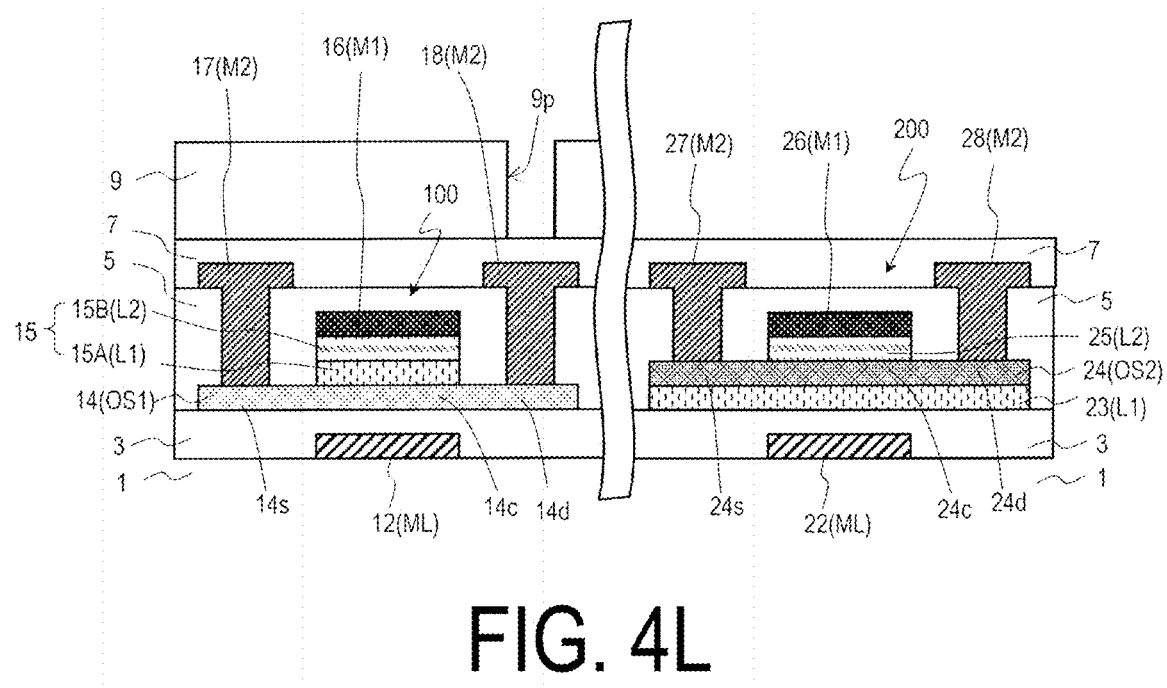
FIG. 4L is a process cross-sectional view illustrating the manufacturing method of the active matrix substrate 1000.
Figure 4M:
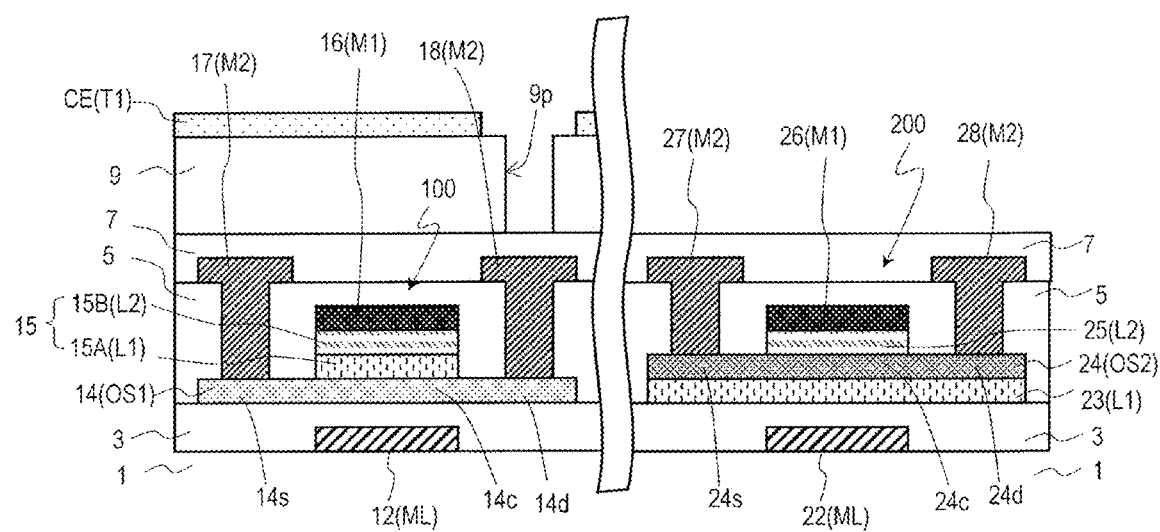
FIG. 4M is a process cross-sectional view illustrating the manufacturing method of the active matrix substrate 1000.
Figure 4N:
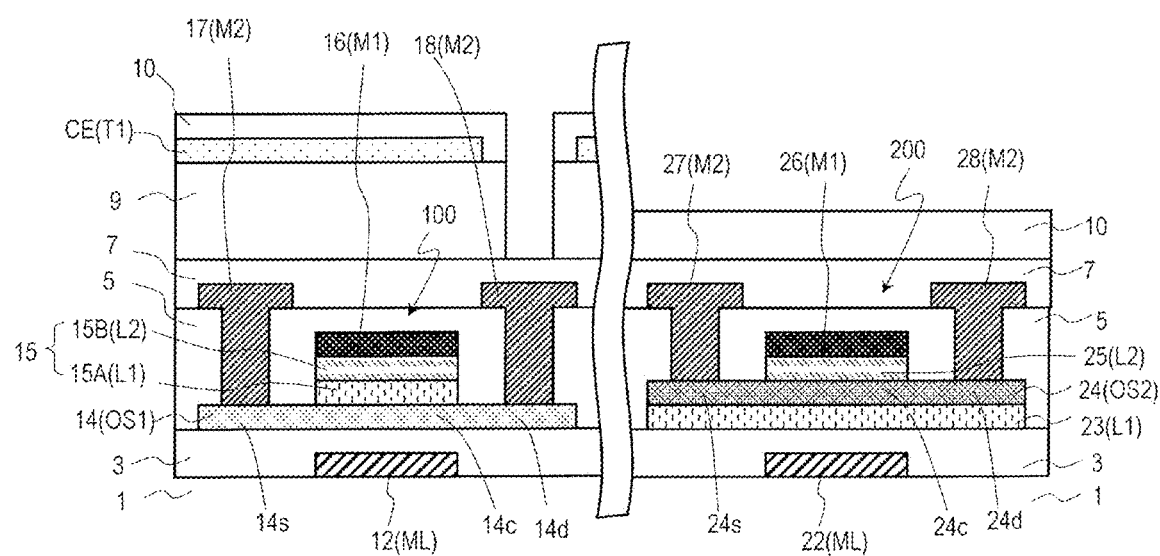
FIG. 4N is a process cross-sectional view illustrating the manufacturing method of the active matrix substrate 1000.
Figure 5:
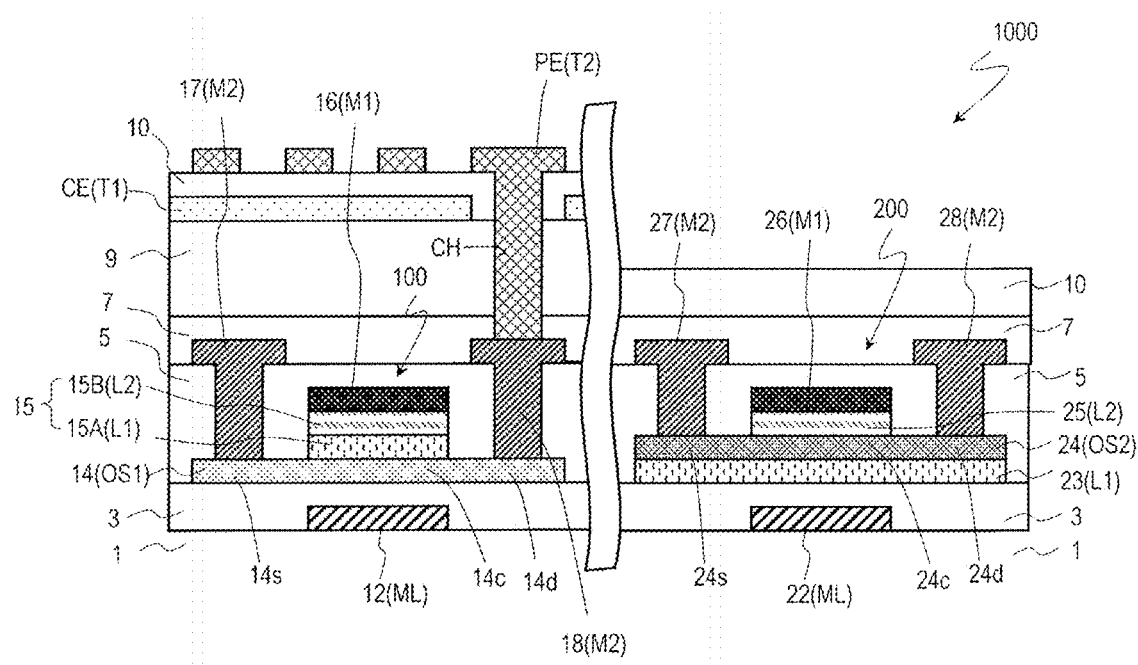
FIG. 5 is a process cross-sectional view illustrating the manufacturing method of the active matrix substrate 1000.

FIGS. 4A to 4N and 5 are cross-sectional views of steps for explaining the manufacturing method of the active matrix substrate 1000, respectively. In these figures, a TFT formation region R1 in which the first TFT 100 is formed and a TFT formation region R2 in which the second TFT 200 is formed are illustrated. Here, in an active matrix substrate applied to an FFS mode display device, a case in which the first TFT 100 is used as a pixel TFT and the second TFT 200 is used as a circuit TFT will be described as an example. Accordingly, the TFT formation region R1 is a part of each pixel area, and the TFT formation region R2 is a part of the non-display region.

Step 1: Formation of Lower Metal Layer ML (FIG. 4A)

A lower conductive film (having a thickness, for example, 50 nm or more and 500 nm or less) is formed on the substrate 1 by, for example, sputtering. Next, the lower conductive film is patterned by a known photolithography process. In this manner, as illustrated in FIG. 4A, the first conductive layer 12 and the second conductive layer 22 of the TFTs are formed in the TFT formation region R1 and the TFT formation region R2, respectively.

As the substrate 1, a transparent substrate with insulating property, for example, a glass substrate, a silicon substrate, a heat-resistant plastic substrate (resin substrate), or the like can be used.

The material of the lower conductive film is not particularly limited, and a film containing a metal such as aluminum (Al), tungsten (W), molybdenum (Mo), tantalum (Ta), chromium (Cr), titanium (Ti), copper (Cu) or the like, or an alloy thereof, or a metal nitride thereof can be appropriately used. Further, a layered film obtained by layering such a plurality of films may be used.

Here, a single-layer film of a metal film (or an alloy film) containing Cu or Al is used as the lower conductive film.

Alternatively, a layered film having a metal film containing Cu or Al as a top layer may be used.

Step 2: Formation of Base Insulating Film 3 (FIG. 4B)

Subsequently, as illustrated in FIG. 4B, the base insulating film 3 (having a thickness of, for example, 200 nm or more and 600 nm or less) is formed so as to cover the first conductive layer 12 and the second conductive layer 22. The base insulating film 3 is formed by, for example, CVD. As the base insulating film 3, a silicon oxide (SiOx) layer, a silicon nitride (SiNx) layer, a silicon oxynitride (SiOxNy; x>y) layer, a silicon nitride oxide (SiNxOy; x>y) layer, or the like may be used as appropriate. The base insulating film 3 may be a single layer or may have a layered structure. For example, a silicon nitride (SiNx) layer, a silicon nitride oxide layer, or the like may be formed on a substrate side (lower layer) in order to prevent diffusion of impurities and the like from the substrate 1, and a silicon dioxide ($SiO_2$) layer, a silicon oxynitride layer, or the like may be formed on a layer (upper layer) on the former layer in order to ensure insulating properties.

Step 3: Formation of First Oxide Semiconductor Film OS1 (FIG. 4C)

Subsequently, the first oxide semiconductor film OS1 is formed on the base insulating film 3. The first oxide semiconductor film OS1 may be formed by, for example, sputtering. Here, as the first oxide semiconductor film OS1, for example, formed is an In—Ga—Zn—O based semiconductor film (In:Ga:Zn=1:1:1).

Step 4: Patterning of First Oxide Semiconductor Film OS1 (FIG. 4D)

Subsequently, the first oxide semiconductor film OS1 is patterned. In this manner, as illustrated in FIG. 4D, the first oxide semiconductor layer 14 serving as the active layer of the first TFT 100 is formed in the TFT formation region R1. The first oxide semiconductor film OS1 is removed from the TFT formation region R2.

The first oxide semiconductor film OS1 may be patterned with, for example, wet etching using a PAN-based etching solution containing phosphoric acid, nitric acid, and acetic acid, or an oxalic acid-based etching solution.

Step 5: Formation of First Insulating Film L1 (FIG. 4E)

Subsequently, the first insulating film L1 is formed so as to cover the base insulating film 3 and the first oxide semiconductor layer 14. Here, as the first insulating film L1, a silicon oxide film is formed by, for example, the CVD.

Step 6: Formation of Second Oxide Semiconductor Film OS2 (FIG. 4F)

Subsequently, the second oxide semiconductor film OS2 having the higher mobility than the first oxide semiconductor film OS1 is formed on the first insulating film L1. The second oxide semiconductor film OS2 may be formed by, for example, sputtering. Here, as the second oxide semiconductor film OS2, formed is, for example, an In—Ga—Zn—O based semiconductor film. The second oxide semiconductor film OS2 may have a larger In atomic ratio than the first oxide semiconductor film OS1. Alternatively, an oxide semiconductor film containing Sn may be formed as the second oxide semiconductor film OS2. A sum of the atomic ratios of In and Sn in the second oxide semiconductor film OS2 may be larger than a sum of the atomic ratios of In and Sn in the first oxide semiconductor film OS1.

Step 7: Patterning of Second Oxide Semiconductor Film OS2 (FIG. 4G)

Subsequently, the second oxide semiconductor film OS2 is patterned. In this manner, as illustrated in FIG. 4G, the second oxide semiconductor layer 24 serving as the active layer of the second TFT 200 is formed in the TFT formation region R2. The second oxide semiconductor film OS2 is removed from the TFT formation region R1.

For the patterning of the second oxide semiconductor film OS2, for example, a PAN-based etching solution or an oxalic acid-based etching solution can be used. When the second oxide semiconductor film OS2 contains Sn, the oxalic acid-based etching solution may be used.

Step 8: Formation of First Metal Layer M1 (FIG. 4H)

Subsequently, the first conductive film (having a thickness of, for example, 50 nm or more and 500 nm or less) (not illustrated) is formed on the second insulating film L2, and the first conductive film is patterned by the known photolithography process. In this manner, as illustrated in FIG. 4H, the gate electrode 16 of the first TFT 100 is formed in the TFT formation region R1, and the gate electrode 26 of the second TFT 200 is formed in the TFT formation region R2. Although not illustrated, the gate bus line is also formed by using the first conductive film.

As the first conductive film, a metal such as molybdenum (Mo), tungsten (W), aluminum (Al), copper (Cu), titanium (Ti), tantalum (Ta) or the like, or an alloy thereof can be used, for example. The first conductive film may have a layered structure including a plurality of layers formed of different conductive materials.

Step 9: Patterning of First Insulating Film L1 and Second Insulating Film L2 (FIG. 4I)

Subsequently, the first insulating film L1 and the second insulating film L2 are patterned by using the resist mask (not illustrated) used for the patterning the first conductive film and the second oxide semiconductor layer 24 as masks. Instead of the resist mask, the first gate electrode 16 and the second gate electrode 26 may be used as masks.

In this manner, as illustrated in FIG. 4I, in the TFT formation region R1, the first insulating film L1 and the second insulating film L2 are etched by using the resist mask or the first gate electrode 16 as the mask, thereby forming the first gate insulating layer 15 between the first gate electrode 16 and the first oxide semiconductor layer 14. The first gate insulating layer 15 has the layered structure including the lower layer 15A made of the first insulating film L1 and the upper layer 15B made of the second insulating film L2.

In the TFT formation region R2, the second insulating film L2 is patterned by using the resist mask or the second gate electrode 26 as the mask, thereby forming the second gate insulating layer 25 including the second insulating film L2 between the second gate electrode 26 and the second oxide semiconductor layer 24. Further, the first insulating film L1 is patterned by using the second oxide semiconductor layer 24 as the mask, thereby forming the lower insulating layer 23 including the first insulating film L1 between the second oxide semiconductor layer 24 and the base insulating film 3. In this example, the lower insulating layer 23 is formed of the same film as the lower layer 15A of the first gate insulating layer 15, and is a layer having the same composition and thickness as the lower layer 15A.

According to this step, when viewed from the normal direction of the substrate 1, the side surfaces of the gate electrodes 16 and 26 are aligned with the side surfaces of the gate insulating layers 15 and 25, respectively. In addition, of the first oxide semiconductor layer 14 and the second oxide semiconductor layer 24, the regions not overlapping the first metal layer M1 are exposed when viewed from the normal direction of the substrate 1.

Thereafter, processing for lowering the resistance may be performed on the exposed regions of the first oxide semiconductor layer 14 and the second oxide semiconductor layer 24. Plasma processing may be performed as the processing for lowering the resistance, for example. In this manner, when viewed from the normal direction of the main surface of the substrate 1, in the first oxide semiconductor layer 14 and the second oxide semiconductor layer 24, the regions not overlapping the first gate electrode 16 and the second gate electrode 26 (exposed regions) become low-resistance regions having a lower specific resistance than the regions 14c and 24c overlapping the first gate electrode 16 and the second gate electrode 26, respectively (including the channel regions). The low-resistance region may be a conductive region (e.g., sheet resistance of 200Ω/☐ or less).

Note that after patterning the first insulating film L1 and the second insulating film L2, the first conductive film may be formed and patterned.

Step 10: Formation of Interlayer Insulating Layer 5 (FIG. 4J)

Subsequently, the interlayer insulating layer 5 is formed so as to cover the first oxide semiconductor layer 14, the second oxide semiconductor layer 24, the first gate insulating layer 15, the second gate insulating layer 25, the first gate electrode 16, and the second gate electrode 26. Thereafter, the interlayer insulating layer 5 is patterned by the known photolithography process. In this manner, as illustrated in FIG. 4J, in the TFT formation region R1, the interlayer insulating layer 5 is formed with the source opening 51s and the drain opening 51d that expose the source contact region 14s and the drain contact region 14d, which are part of the low-resistance region of the first oxide semiconductor layer 14, respectively. Similarly, in the TFT formation region R2, the interlayer insulating layer 5 is formed with the source opening 52s and the drain opening 52d that expose the source contact region 24s and the drain contact region 24d, which are part of the low-resistance region of the second oxide semiconductor layer 24, respectively.

The interlayer insulating layer 5 can be formed with a single layer or a multi-layer of an inorganic insulating layer such as a silicon oxide film, a silicon nitride film, a silicon oxynitride film, a silicon nitride oxide film and the like. The thickness of the inorganic insulating layer may be 100 nm or more and 500 nm or less. It is preferable to form the interlayer insulating layer 5 by using an insulating film that reduces an oxide semiconductor such as a silicon nitride film, because the specific resistance of the regions of the oxide semiconductor layers 14 and 24 in contact with the interlayer insulating layer 5 (here, the low-resistance regions) can be maintained low. Here, an SiNx layer (having a thickness of 300 nm) is formed as the interlayer insulating layer 5 by the CVD.

When an insulating layer capable of reducing an oxide semiconductor (for example, a hydrogen donating layer such as a silicon nitride layer) is used as the interlayer insulating layer 5, even when the above-mentioned processing for lowering resistance is not performed, of the oxide semiconductor layers 14 and 24, the portions being in contact with the interlayer insulating layer 5 (the interlayer insulating layer 5 prior to patterning) can be made lower in resistance than the portions that are not contact with the interlayer insulating layer 5.

Step 11: Formation of Second Metal Layer M2 (FIG. 4K)

Subsequently, the second conductive film (having a thickness of, for example, 50 nm or more and 500 nm or less) (not illustrated) is formed on the interlayer insulating layer 5, and the second conductive film is patterned. In this manner, as illustrated in FIG. 4K, the second metal layer M2 including the first source electrode 17, the first drain electrode 18, the second source electrode 27, and the second drain electrode 28 is formed. Although not illustrated, the source bus line is also formed of the second conductive film.

In the TFT formation region R1, the first source electrode 17 and the first drain electrode 18 are arranged on the interlayer insulating layer 5 and in the source opening 51s and the drain opening 51d, respectively, and are connected to the first oxide semiconductor layer 14 in the source opening 51s and the drain opening 51d, respectively. In the TFT formation region R2, the second source electrode 27 and the second drain electrode 28 are arranged on the interlayer insulating layer 5 and in the source opening 52s and the drain opening 52d, respectively, and are connected to the second oxide semiconductor layer 24 in the source opening 52s and the drain opening 52d, respectively. In this manner, the first TFT 100 and the second TFT 200 are manufactured.

As the second conductive film, an element selected from aluminum (Al), chromium (Cr), copper (Cu), tantalum (Ta), titanium (Ti), molybdenum (Mo), and tungsten (W), or an alloy containing these elements as components can be used. For example, the second conductive film may have a triple-layer structure of titanium film-aluminum film-titanium film, or a triple-layer structure of molybdenum film-aluminum film-molybdenum film can be used. Note that the second conductive film is not limited to the triple-layer structure, and may have a single layer or a dual-layer structure, or a layered structure of four or more layers. Here, a layered film having a Ti film (having a thickness of 15 to 70 nm) as a lower layer and a Cu film (having a thickness of 50 to 400 nm) as an upper layer are used. By using a layered film using an ohmic conductive film such as a Ti film as the lowest layer, the contact resistance with the oxide semiconductor layers 14 and 24 can be reduced more effectively.

Step 12: Formation of Inorganic Insulating Layer 7 and Organic Insulating Layer 9 (FIG. 4L)

Subsequently, as illustrated in FIG. 4L, the inorganic insulating layer 7 (having a thickness of 100 nm or more and 500 nm or less, for example) and the organic insulating layer 9 (having a thickness of 1 to 4 μm, preferably 2 to 3 μm, for example) are formed in this order so as to cover the interlayer insulating layer 5 and the second metal layer M2.

As the inorganic insulating layer 7, an inorganic insulating film similar to that of the interlayer insulating layer 5 can be used. Here, as the inorganic insulating layer 7, for example, an SiNx layer (having a thickness of 300 nm) is formed by the CVD. The organic insulating layer 9 may be, for example, an organic insulating film containing a photosensitive resin material (for example, an acrylic resin film).

Thereafter, the organic insulating layer 9 is patterned. In this manner, in each pixel area, an opening 9p for exposing a part of the inorganic insulating layer 7 is formed in the organic insulating layer 9. The opening 9p is arranged so as to overlap the first drain electrode 18 of the first TFT 100, which is the pixel TFT, when viewed from the normal direction of the substrate 1. By this patterning, the entire portion of the organic insulating layer 9 located in the non-display region (including the TFT formation region R2) may be removed.

Step 13: Formation of Common Electrode CE (FIG. 4M)

Subsequently, as illustrated in FIG. 4M, a first transparent conductive film (having a thickness of 20 to 300 nm) (not illustrated) is formed on the organic insulating layer 9 and patterned. In this manner, a common electrode CE is formed in the display region. As the first transparent conductive film, a metal oxide such as indium-zinc oxide, indium-tin oxide (ITO), ZnO or the like can be used.

Step 14: Formation of Dielectric Layer 10 (FIG. 4N)

Subsequently, as illustrated in FIG. 4N, a dielectric layer 10 (having a thickness of 50 to 500 nm) is formed so as to cover the common electrode CE.

A material of the dielectric layer 10 may be the same as the material exemplified as the material of the inorganic insulating layer 7. Here, as the dielectric layer 10, an SiN film is formed by, for example, the CVD.

Step 15: Formation of Pixel Electrode PE (FIG. 5)

Subsequently, the dielectric layer 10 and the inorganic insulating layer 7 are patterned to form a pixel contact hole CH that exposes the first drain electrode 18 of the first TFT 100. In this example, the pixel contact hole CH is configured of an opening in the dielectric layer 10, an opening in the organic insulating layer 9, and an opening in the inorganic insulating layer 7.

Then, a second transparent conductive film (having a thickness of 20 to 300 nm) (not illustrated) is formed on the dielectric layer 10 and in the pixel contact hole CH. The second transparent conductive film can be formed using a material similar to that of the first transparent conductive film. Thereafter, the second transparent conductive film is patterned. In this manner, as illustrated in FIG. 5, a pixel electrode PE is formed in each pixel area. The pixel electrode PE is connected to the first drain electrode 18 of the first TFT 100, which is the pixel TFT, in the pixel contact hole CH. In this manner, the active matrix substrate 1000 is manufactured.

Note that the pixel electrode PE and the common electrode CE may be arranged so as to face with each other with the dielectric layer 10 interposed therebetween. Here, an example in which the common electrode CE is arranged on the substrate 1 side of the pixel electrode PE is illustrated, but the common electrode CE may be arranged on the pixel electrode PE with the dielectric layer 10 interposed therebetween.

Although the example in which the first TFT 100 is used as the pixel TFT is described above, the first TFT 100 may be used as a circuit TFT (for example, a drive circuit TFT). In this case, the first gate electrode 16, the first source electrode 17, and the first drain electrode 18 of the first TFT 100 are each connected to predetermined wiring lines. The organic insulating layer 9 and the transparent conductive films may not be arranged above the first TFT 100.

Modification Example

Figure 6:
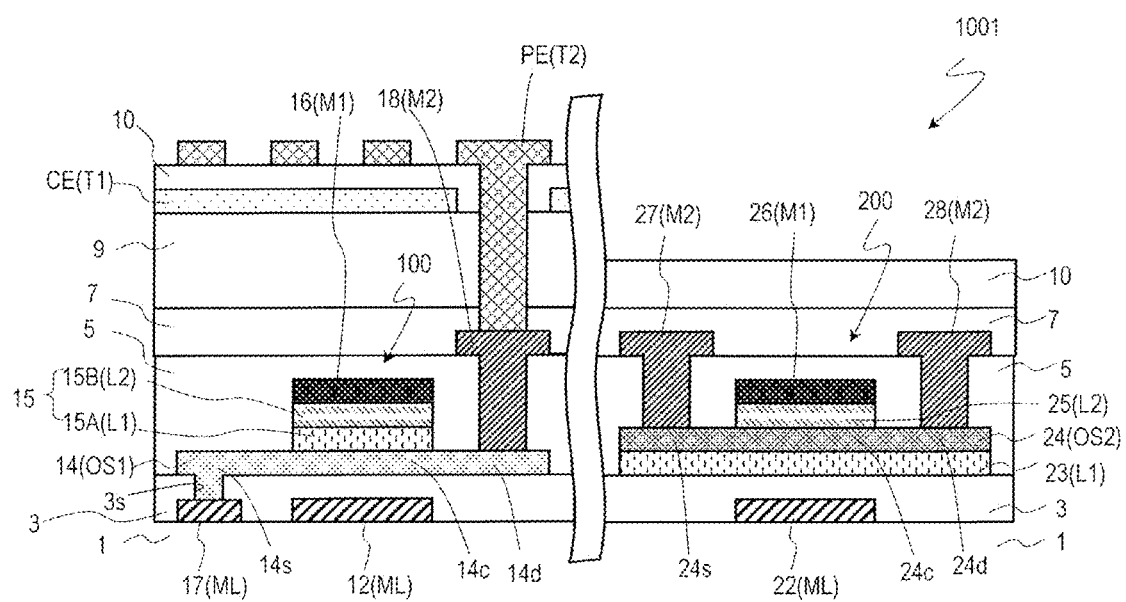
FIG. 6 is a schematic cross-sectional view of the first TFT 100 and the second TFT 200 in another active matrix substrate 1001 of the first embodiment.

FIG. 6 is a cross-sectional view illustrating the first TFT 100 and the second TFT 200 in an active matrix substrate 1001 of the modification example. FIG. 6 illustrates an example in which the first TFT 100 is the pixel TFT and the second TFT 200 is the circuit TFT.

The active matrix substrate 1001 differs from the active matrix substrate 1000 in that the first source electrode 17 and the source bus line SL (not illustrated) of the first TFT 100 are formed in the same layer as the first conductive layer 12 (that is, in the lower metal layer ML). The first source electrode 17 may be a part of the source bus line SL. The first drain electrode 18 of the first TFT 100, and the second source electrode 27 and the second drain electrode 28 of the second TFT 200 may all be formed in the second metal layer M2.

In the active matrix substrate 1001, the source contact region 14s of the first oxide semiconductor layer 14 is electrically connected to the first source electrode 17 in an opening 3s formed in the base insulating film 3. Such a structure can be obtained by forming the opening 3s by adding a step of patterning the base insulating film 3 after forming the base insulating film 3 and before forming the first oxide semiconductor film OS1.

When the first TFT 100 is used as the circuit TFT, both the first source electrode 17 and the first drain electrode 18 may be formed in the lower metal layer ML. Also in this case, the second source electrode 27 and the second drain electrode 28 of the second TFT 200 are formed in the second metal layer M2. This is because, in the second TFT 200, the first insulating film L1 exists below the second oxide semiconductor film OS2, which is the active layer, so that a contact hole connecting the second oxide semiconductor film OS2 and the first metal layer M1 cannot be formed by simply adding the step of patterning the base insulating film 3. Accordingly, it is difficult to form the second source electrode 27 and the second drain electrode 28 in the lower metal layer ML without increasing the manufacturing process.

A substrate structure in which the source bus line SL is located on the substrate 1 side relative to the gate bus line GL and the active layer of the pixel TFT, such as the active matrix substrate 1001, may be referred to as a "lower source wiring line structure". In the active matrix substrate having the lower source wiring line structure, the insulating layer located between the source bus line and the gate bus line can be thickened, so that the parasitic capacitance generated at intersections with these bus lines can be reduced. The lower source wiring line structure is described, for example, in WO 2015/186619 by the applicant. The entire contents of the disclosure of WO 2015/186619 are incorporated herein by reference.

Configuration and Operation of Gate Drive Circuit

A circuit configuration and operation of the gate driver monolithically formed in the active matrix substrate will be described. The gate driver includes a shift register. The shift register includes a plurality of unit shift register circuits connected in multiple stages.

Figure 7:
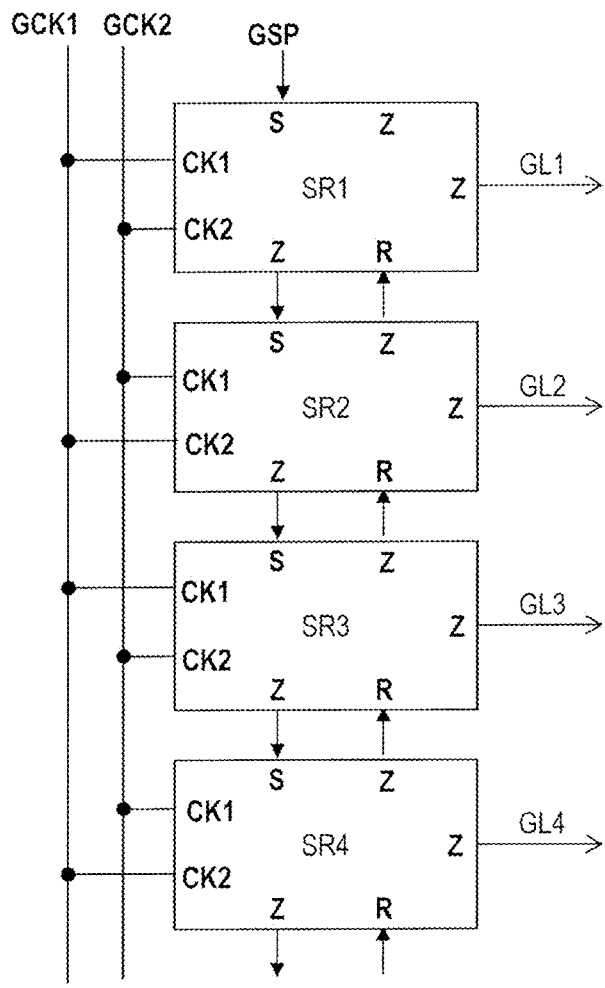
FIG. 7 is a diagram illustrating a shift register circuit.

FIG. 7 is a diagram illustrating the shift register circuit.

The shift register circuit includes a plurality of unit shift register circuits SR1 to SRz (z is an integer of 2 or more) (hereinafter, collectively referred to as "unit shift register circuit SR"). The unit shift register circuit SR in each stage includes a set terminal S that receives a set signal, an output terminal Z that outputs an output signal, a reset terminal R that receives a reset signal, and clock input terminals CK1 and CK2 that receive clock signals GCK1 and GCK2. In the unit shift register circuit SRα (α≥2), the output signal of the unit shift register circuit SR in the previous stage is inputted to the set terminal S. The set terminal S of the unit shift register circuit SR1 in the first stage receives a gate start pulse signal GSP. The unit shift register circuit SR in each stage also outputs the output signal to a corresponding gate bus line GL arranged in the display region. The reset terminal R receives an output signal from the unit shift register circuit in the next stage. The reset terminal R of the unit shift register circuit SRz in the final stage receives a clear signal.

The two clock input terminals receive two-phase clock signals GCK1 and GCK2, respectively. One of the clock input terminals receives the clock signal GCK1, and the other of the clock input terminals receives the clock signal GCK2. The clock signals to be inputted to the respective clock input terminals are configured to be alternately switched between adjacent stages.

Figure 8:
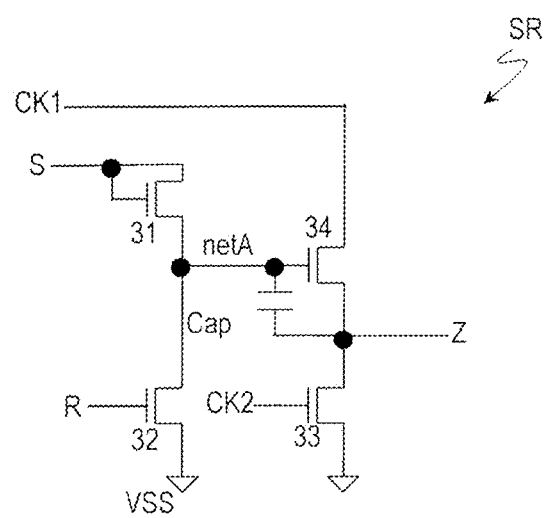
FIG. 8 is a diagram illustrating an example of a unit shift register circuit SR.

FIG. 8 is a diagram illustrating an example of the unit shift register circuit SR. In the example, the unit shift register circuit SR includes four TFTs 31 to 34 and a capacitance portion Cap.

The TFT 31 is an input transistor. A gate and a drain of the TFT 31 are connected to the set terminal, and a source of the TFT 31 is connected to a gate of the TFT 34. The TFT 34 is an output transistor. A drain of the TFT 34 is connected to the clock input terminal CK1, and a source of the TFT 34 is connected to the output terminal Z. That is, the TFT 34 serves as a transmission gate to pass and block the clock signal to be inputted to the clock input terminal CK1.

The capacitance portion Cap is connected between the gate and the source of the TFT 34 being the output transistor. In the description, a node connected to the gate of the TFT 34 is referred to as a "node netA" and a node connected to the output terminal Z is referred to as a "node Z". One electrode of the capacitance portion Cap is connected to the gate of the TFT 34 and the node netA, and another electrode is connected to the source of the TFT 34 and the node Z.

The TFT 32 is arranged between a low power supply input terminal and the node netA. The TFT 32 serves as a pull-down transistor to reduce a potential at the node netA. A gate of the TFT 32 is connected to the reset terminal, a drain of the TFT 32 is connected to the node netA, and a source of the TFT 32 is connected to the low power supply input terminal.

The TFT 33 is connected to the node Z. A gate of the TFT 33 is connected to the input terminal of the clock signal CK2, a drain of the TFT 33 is connected to the node Z, and a source of the TFT 33 is connected to the low power supply input terminal.

In the present embodiment, the first TFT 100 may be used as the TFTs 31 to 34. Alternatively, the second TFT 200 having large current driving force (high mobility) may be used at least as the output transistor TFT 34, and the first TFT 100 may be used as the other TFTs. As a result, two types of TFTs having different characteristics can be mixed in the drive circuit depending on the use. In addition, regardless of the respective TFT structures, any one of the TFTs 31 to 34 preferably has enhancement characteristics.

Note that the configuration of the drive circuit is not limited to the illustrated configuration. For example, the unit shift register circuit may have five or more TFTs including an output transistor.

Configuration and Operation of SSD Circuit

A circuit configuration and operation of the SSD monolithically formed in the active matrix substrate will be described.

Figure 9:
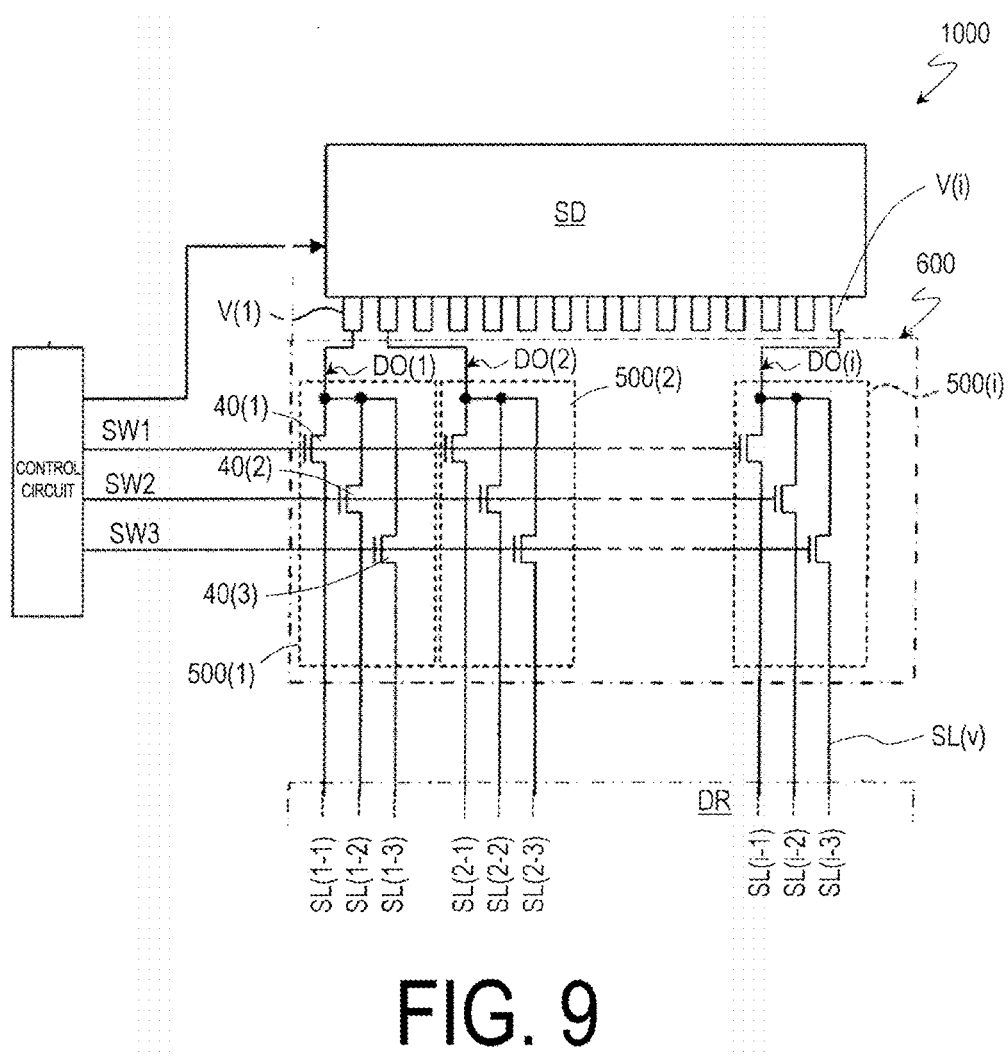
FIG. 9 is a diagram for explaining the configuration and operation of an SSD circuit.

FIG. 9 is a diagram for explaining the configuration and operation of the SSD circuit.

An SSD circuit 600 is arranged between the source driver SD and the display region DR. The SSD circuit 600 includes a plurality of SSD unit circuits 500(1) to 500(*i*) (i is an integer of 2 or more) (collectively referred to as "SSD unit circuit 500" in some cases) and control signal trunk lines SW1 to SWn (n is an integer of 2 or more, here n=3). The SSD circuit 600 and the source driver SD are controlled by a control circuit provided in the non-display region FR. The control signal trunk lines SW1 to SWn are connected to the control circuit.

Each of output terminals V(1) to V(i) of the source driver SD (hereafter, collectively referred to as "V terminal" in some cases) is connected to one of a plurality of video signal lines DO(1) to DO(i) (collectively referred to as "video signal line DO" in some cases). A grouped n source bus lines SL are associated with one video signal line DO. For each video signal line, the SSD unit circuit 500 is provided between the video signal line DO and the grouped source bus lines SL. The SSD unit circuit 500 distributes video data from one video signal line DO to the n source bus lines SL.

In the present embodiment, the N-th video signal line among the plurality of video signal lines DO(1) to DO(i) is designated as DO(N) (N is an integer from 1 to i), and the SSD unit circuit 500 and the source bus lines SL associated with the video signal line DO(N) are designated as 500(N) and SL(N-1) to SL(N-n), respectively. The source bus lines SL(N-1) to SL(N-n) may be associated, for example, with R, G, and B pixels (i.e., n=3).

Each SSD unit circuit 500 (N) includes at least n (here, three) thin film transistors (SSD circuit TFTs) 40(1) to 40(*n*) (which may be collectively referred to as "SSD circuit TFT 40").

The SSD circuit TFT 40 functions as a selection switch. A gate electrode of the SSD circuit TFT 40 is electrically connected to corresponding one among the n control signal trunk lines SW1 to SWn. A source electrode of the SSD circuit TFT 40 is electrically connected to a branch wiring line of the video signal line DO(N). A drain electrode of the SSD circuit TFT 40 is connected to one among the corresponding source bus lines SL(N-1) to SL(N-3).

A selection signal (control signal) is supplied to the gate electrode of the SSD circuit TFT 40 from one of the control signal trunk lines SW1 to SW3. The control signal defines an on period of the selection switch within the same group and is synchronized with the time-sequential signal outputted from the source driver SD. The SSD unit circuit 500(N) writes the data potentials obtained by time-dividing the output of the video signal line DO(N) to the plurality of source bus lines from SL(N-1) to SL(N-n) (time division drive) time-sequentially. As a result, the number of V terminals of the source driver SD can be reduced, so that the area of the non-display region FR can be further reduced (the frame can be narrowed).

As previously mentioned, in the present embodiment, the second TFT 200 with a high mobility may be suitably applied to the SSD circuit TFT 40. The second TFT 200 may have depletion characteristics.

Note that the configuration of the SSD circuit is not limited to the illustrated configuration. The configuration, operation, and the like of the SSD circuit are disclosed in JP 2008-225036 A, JP 2006-119404 A, WO 2011/118079, and the like. In the description, the entire contents of the disclosures of JP 2008-225036 A, JP 2006-119404 A, and WO 2011/118079 are incorporated herein by reference.

Second Embodiment

An active matrix substrate according to a second embodiment is used for an organic EL display device. In the following, the differences from the active matrix substrate according to the first embodiment will be mainly described.

Figure 10:
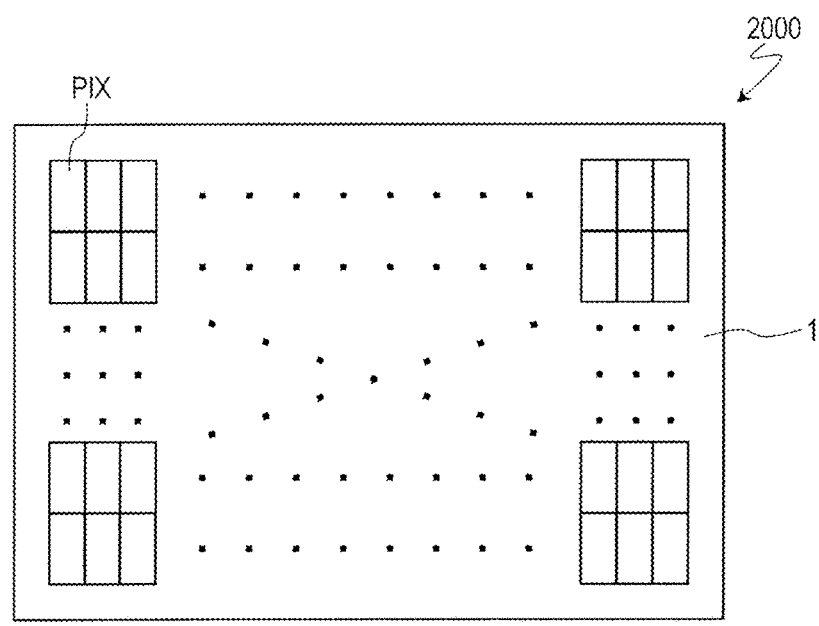
FIG. 10 is a schematic diagram illustrating an example of a planar structure of an active matrix substrate 2000 according to a second embodiment.

FIG. 10 is a schematic view illustrating an example of a planar structure of an active matrix substrate 2000 according to the present embodiment.

The active matrix substrate 2000 includes a plurality of pixel areas PIX arranged in a matrix. The plurality of pixel areas PIX typically include pixel areas corresponding to red pixels that display red, green pixels that display green, and blue pixels that display blue.

Figure 11:
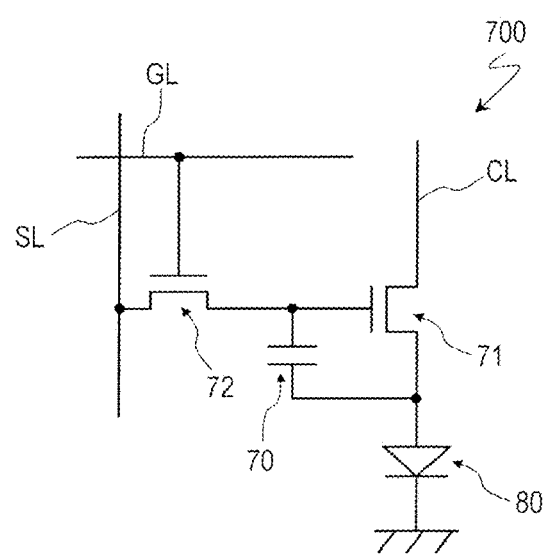
FIG. 11 is a diagram illustrating a pixel circuit.

Each of the plurality of pixel areas PIX includes the substrate 1 and a pixel circuit (not illustrated in FIG. 10) provided on the substrate 1. FIG. 11 illustrates an example of the pixel circuit.

A pixel circuit 700 illustrated in FIG. 11 includes a drive TFT 71, a selection TFT 72, and a capacitance element (holding capacitor) 70. The drive TFT 71 and the selection TFT 72 are oxide semiconductor TFTs supported on the substrate 1, respectively.

A gate electrode of the selection TFT 72 is connected to the gate bus line GL. A source electrode of the selection TFT 72 is connected to the source bus line SL. A drain electrode of the selection TFT 72 is connected to a gate electrode of the drive TFT 71 and the capacitance element 70. A source electrode of the drive TFT 71 is connected to a current supply line CL. A drain electrode of the drive TFT 71 is connected to an organic light emitting diode (OLED) 80 formed on the active matrix substrate 2000.

When an on signal is supplied from the gate bus line GL to the gate electrode of the selection TFT 72, the selection TFT 72 is brought into an on state, and thus a signal voltage from the source bus line SL (corresponding to desired light emission luminance of the OLED 80) is applied to the capacitance element 70 and the gate electrode of the drive TFT 71 via the selection TFT 72. When the drive TFT 71 is brought into the on state by the signal voltage, a current from the current supply line CL flows through the drive TFT 71 to the OLED 80, and then the OLED 80 emits light.

According to the present embodiment, a plurality of oxide semiconductor TFTs (here, the drive TFT 71 and the selection TFT 72) having different required characteristics can be produced separately in the pixel circuit 700. Specifically, the first TFT may be used as the drive TFT 71, and the second TFT may be used as the selection TFT 72.

Figure 12:
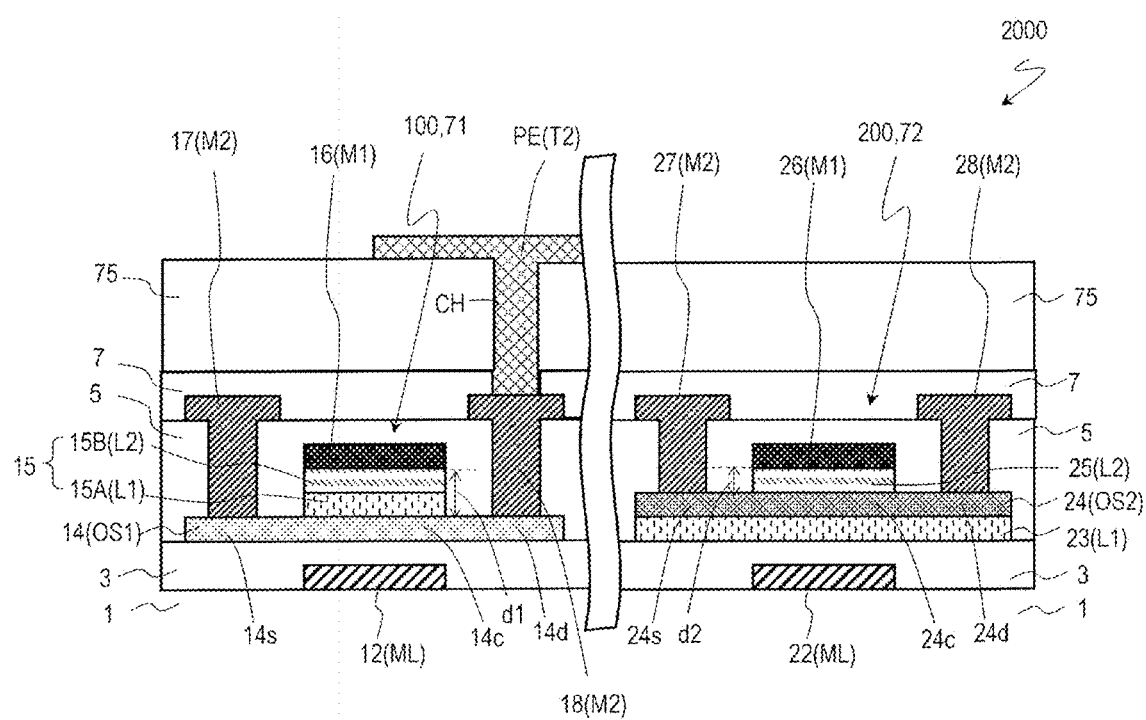
FIG. 12 is a schematic cross-sectional view illustrating the first TFT 100 and the second TFT 200 in the active matrix substrate 2000.

FIG. 12 is a cross-sectional view illustrating the first TFT 100 and the second TFT 200 in the active matrix substrate 2000. Here, the first TFT 100 is used as the drive TFT 71 and the second TFT 200 is used as the selection TFT 72 in the pixel circuit 700. Note that the second TFT 200 may be used as the drive circuit TFT.

The structures of the first TFT 100 and the second TFT 200 are similar to those described above with reference to FIG. 2. However, when applied to a top-emitting organic EL display device, the first conductive layer 12 and the second conductive layer 22 may not be formed as light blocking layers in the respective TFTs.

A flattened layer 75 is provided on the drive TFT 71 and the selection TFT 72. A pixel electrode PE is provided on the flattened layer 75. The drain electrode 18 of the drive TFT 71 is electrically connected to the pixel electrode PE. Note that when applied to a color filter organic EL display device, a color filter layer (not illustrated) is further provided between the flattened layer 75 and the inorganic insulating layer 7. A bank (not illustrated) formed of an insulating material is provided between adjacent pixel areas on the flattened layer 75 and the pixel electrode PE. Further, although not illustrated, an organic EL layer is arranged on the pixel electrode PE, and an upper electrode is provided on the organic EL layer. For example, the pixel electrode PE functions as an anode electrode and the upper electrode functions as a cathode electrode.

Note that the configuration of the pixel circuit is not limited to the configuration illustrated in FIG. 11. Each pixel circuit may have three or more TFTs. Even in this case, the first TFT 100 is used at least as the drive TFT 71. For other TFTs, the first TFT 100 or the second TFT 200 may be used depending on the use.

The compositions, thicknesses, and the like of the first oxide semiconductor film OS1 and the second oxide semiconductor film OS2 may be the same as those in the aforementioned embodiment. The compositions of the first insulating film L1 and the second insulating film L2 may be the same as those in the aforementioned embodiment. However, in the present embodiment, in the first TFT 100 used as the drive TFT 71, the thickness d1 of the first gate insulating layer 15 of the first TFT 100 (that is, the total thickness of the first insulating film L1 and the second insulating film L2) is preferably set to be larger than that in the aforementioned embodiment. Thereby, the S value of the first TFT 100 can be increased. The thickness d1 may be 200 nm or more and 500 nm or less, for example. The thickness d2 of the second gate insulating layer 25 of the second TFT 200, that is, the thickness of the second insulating film L2 may be, for example, 50 nm or more and 150 nm or less. The first insulating film L1 may be thicker than the second insulating film L2. Thereby, the S value of the first TFT 100 can be increased more effectively while increasing the on current of the second TFT 200.

Note that in the first TFT 100, the S value can be further increased by increasing a channel length L, for example.

Although not illustrated in the figure, a gate drive circuit may be monolithically formed in the non-display region of the active matrix substrate 2000. In this case, the second TFT 200 can be used as the drive circuit TFT. It is also possible to mix TFTs having different characteristics in the gate drive circuit depending on the use. For example, the second TFT 200 may be used at least as an output transistor, and the first TFT 100 may be used as the other drive circuit TFTs.

Figure 13:
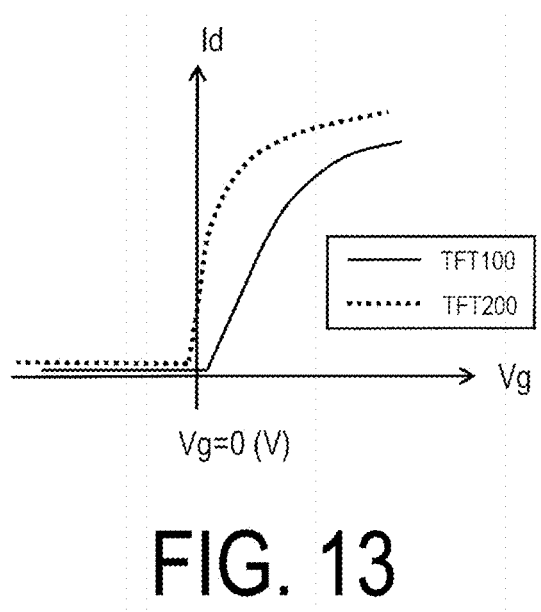
FIG. 13 is a diagram illustrating Vg-Id characteristics of the first TFT 100 and the second TFT 200 in the active matrix substrate 2000.

FIG. 13 is a diagram illustrating Vg-Id characteristics of the first TFT 100 and the second TFT 200. The horizontal axis of the graph represents the potential of a gate electrode based on the potential of the drain electrode (gate-drain voltage) Vg, and the vertical axis of the graph represents a drain current Id.

From FIG. 13, it can be seen that the threshold voltage of the first TFT 100 is shifted in a positive direction from the threshold voltage of the second TFT 200. In this example, the first TFT 100 has enhancement characteristics that the threshold voltage is positive, and the second TFT 200 has depletion characteristics that the threshold voltage is negative. Further, the V-I characteristic of the first TFT 100 is gentler than that of the second TFT 200. That is, the S value of the first TFT 100 is larger than that of the second TFT 200. Note that the positive/negative and magnitude of the threshold voltage and the slope of the V-I characteristic of each TFT, and the like are not limited to the illustrated examples.

In the organic EL display device, since the first TFT 100 has a large S value, the first TFT 100 is suitably used as the drive TFT in the pixel circuit. As a result, the multi-gray scale display can be suitably performed. Additionally, as illustrated in the figure, when the first TFT 100 has the enhancement characteristics, the first TFT 100 may be suitably used for some circuit TFTs such as a drive circuit TFT. As a result, circuit malfunction can be suppressed, thereby reducing yield loss.

On the other hand, the second TFT 200 has large current driving force (on current). In addition, a channel can be shortened, thereby reducing a circuit area. Further, since the second gate insulating layer 25 can be made thin, the second TFT 200 may have high switching characteristics. The second TFT 200 is suitably used as a selection TFT in a pixel circuit, for example. As a result, the second TFT 200 can be applied to high frequency or high definition models. Further, the second TFT 200 may also be used as the output transistor in the gate drive circuit.

Table 2 illustrates suitable characteristics of the drive TFT and the selection TFT in the pixel circuit and the drive circuit TFT for the organic EL display devices. The characteristics and numerical ranges set forth in Table 2 are examples, and are not limited to the characteristics of each TFT.

TABLE 2

| Use of TFT | Drive TFT in pixel circuit | Selection TFT in pixel circuit | Output transistor in drive circuit |
|---|---|---|---|
| Threshold voltage | Enhancement 1 V or more | Depletion to enhancement −1 V or more | Enhancement 0 V or more |
| Mobility | Low to medium 10 cm$^2$/Vs or less | High 20 cm$^2$/Vs or more | High 20 cm$^2$/Vs or more |
| S value | Large | Small | Small |
| TFT structure | First TFT | Second TFT | Second TFT |

In the present embodiment as well, as illustrated in FIG. 6, the first source electrode 17 and the source bus line of the first TFT 100 may be formed in the first metal layer M1 (lower source wiring line structure).

Oxide Semiconductor

The oxide semiconductor included in the oxide semiconductor layer of each TFT according to the present embodiment may be an amorphous oxide semiconductor or a crystalline oxide semiconductor including a crystalline portion. Examples of the crystalline oxide semiconductor include a polycrystalline oxide semiconductor, a microcrystalline oxide semiconductor, and a crystalline oxide semiconductor having a c-axis oriented substantially perpendicular to the layer surface.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. In a case where the oxide semiconductor layer has a dual-layer structure including an upper layer and a lower layer, an energy gap of the oxide semiconductor included in a layer positioned on the gate electrode side of the dual-structure (that is the lower layer in the case of the bottom gate structure, and the upper layer in the case of the top gate structure) may be smaller than an energy gap of the oxide semiconductor included in a layer positioned opposite to the gate electrode (that is the upper layer in the case of the bottom gate structure, and the lower layer in the case of the top gate structure). However, in a case where a difference in the energy gap between these layers is relatively small, the energy gap of the oxide semiconductor included in the layer positioned on the gate electrode side may be greater than the energy gap of the oxide semiconductor included in the layer positioned opposite to the gate electrode.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated herein by reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2, or the like. Such an oxide semiconductor layer can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein by reference. A TFT including an In—Ga—Zn—O based semiconductor layer has a high mobility (more than 20 times as compared to an a-Si TFT) and a low leakage current (less than 1/100-th as compared to the a-Si TFT). Thus, such a TFT can be suitably used as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, an In—W—Zn—O based semiconductor, and the like.

INDUSTRIAL APPLICABILITY

Embodiments of the present disclosure may be suitably applied to an active matrix substrate including the monolithically formed peripheral circuits. Such an active matrix substrate can be applied to various electronic devices such as a display device such as a liquid crystal display device, an organic electroluminescence (EL) display device, and an inorganic electroluminescence display device and the like, an imaging device such as an image sensor, an image input device, a fingerprint reader, and a semiconductor memory and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate comprising:
a substrate; and
a plurality of oxide semiconductor TFTs including a first TFT and a second TFT supported on the substrate,
wherein the first TFT includes
a first oxide semiconductor layer,
a first gate electrode arranged on a part of the first oxide semiconductor layer with a first gate insulating layer interposed between the first oxide semiconductor layer and the first gate electrode, and
a first source electrode and a first drain electrode electrically connected to the first oxide semiconductor layer,
the first gate insulating layer has a layered structure including a first insulating film and a second insulating film arranged on the first insulating film,
the second TFT includes
a second oxide semiconductor layer having a higher mobility than the first oxide semiconductor layer,
a second gate electrode arranged on a part of the second oxide semiconductor layer with a second gate insulating layer interposed between the second oxide semiconductor layer and the second gate electrode, and
a second source electrode and a second drain electrode electrically connected to the second oxide semiconductor layer, and
the second gate insulating layer includes the second insulating film and does not include the first insulating film, and
the active matrix substrate further including a lower insulating layer including the first insulating film arranged between the second oxide semiconductor layer and the substrate.

2. The active matrix substrate according to claim 1, wherein a side surface of the second oxide semiconductor layer and a side surface of the lower insulating layer are aligned with each other.

3. The active matrix substrate according to claim 1, wherein a side surface of the first gate insulating layer and a side surface of the first gate electrode are aligned with each other, and a side surface of the second gate insulating layer and a side surface of the second gate electrode are aligned with each other.

4. The active matrix substrate according to claim 1, wherein the first insulating film and the second insulating film are both silicon oxide films.

5. The active matrix substrate according to claim 1,
wherein the first TFT further includes a first conductive layer arranged on the substrate side of the first oxide semiconductor layer with a third insulating film interposed between the first oxide semiconductor layer and the first conductive layer, and when viewed from a normal direction of the substrate, the first conductive layer at least partially overlaps the first oxide semiconductor layer, and
the second TFT further includes a second conductive layer arranged on the substrate side of the lower insulating layer with the third insulating film interposed between the lower insulating layer and the second conductive layer, and when viewed from the normal direction of the substrate, the second conductive layer at least partially overlaps the second oxide semiconductor layer.

6. The active matrix substrate according to claim 1 having a display region that includes a plurality of pixel areas and a non-display region arranged around the display region, the active matrix substrate further comprising:
a plurality of pixel TFTs each arranged in the plurality of pixel areas; and
a peripheral circuit arranged in the non-display region,
wherein each of the plurality of pixel TFTs is the first TFT, and
the peripheral circuit includes the second TFT.

7. The active matrix substrate according to claim 1 having a display region that includes a plurality of pixel areas and a non-display region arranged around the display region, the active matrix substrate further comprising:
a gate drive circuit and an SSD circuit arranged in the non-display region,
wherein the gate drive circuit includes the first TFT, and the SSD circuit includes the second TFT.

8. The active matrix substrate according to claim 1 having a display region that includes a plurality of pixel areas and a non-display region arranged around the display region,
wherein each of the plurality of pixel areas includes a pixel circuit including a selection TFT, a drive TFT, and a capacitance element,
the drive TFT is the first TFT, and
the selection TFT is the second TFT.

9. The active matrix substrate according to claim 1 having a display region that includes a plurality of pixel areas and a non-display region arranged around the display region, the active matrix substrate further comprising:
a plurality of pixel circuits, each of the plurality of pixel circuits being arranged in each of the plurality of pixel areas and including a selection TFT, a drive TFT, and a capacitance element; and
a gate drive circuit arranged in the non-display region,
wherein the drive TFT is the first TFT, and
the gate drive circuit includes the second TFT.

10. The active matrix substrate according to claim 1, the active matrix substrate further comprising:
an interlayer insulating layer covering the first oxide semiconductor layer, the first gate electrode, the second oxide semiconductor layer, and the second gate electrode,
wherein the first source electrode, the first drain electrode, the second source electrode, and the second drain electrode are arranged on the interlayer insulating layer.

11. The active matrix substrate according to claim 1, the active matrix substrate further comprising:
an interlayer insulating layer covering the first oxide semiconductor layer, the first gate electrode, the second oxide semiconductor layer, and the second gate electrode,
wherein the first drain electrode, the second source electrode, and the second drain electrode are arranged on the interlayer insulating layer, and
the first source electrode is arranged on the substrate side of the first oxide semiconductor layer with a third insulating film interposed between the first oxide semiconductor layer and the first source electrode.

12. The active matrix substrate according to claim 1,
wherein the first oxide semiconductor layer and the second oxide semiconductor layer each contain In and/or Sn, and
a sum of atomic ratios of In and Sn to all metal elements in the first oxide semiconductor layer is smaller than a sum of atomic ratios of In and Sn to all metal elements in the second oxide semiconductor layer.

13. The active matrix substrate according to claim 1,
wherein both the first oxide semiconductor layer and the second oxide semiconductor layer contain an In—Ga—Zn—O based semiconductor, and an atomic ratio of In to all metal elements in the first oxide semiconductor layer is smaller than an atomic ratio of In to all metal elements in the second oxide semiconductor layer.

14. The active matrix substrate according to claim 13, wherein the In—Ga—Zn—O based semiconductor in the first oxide semiconductor layer and/or the second oxide semiconductor layer contains a crystalline portion.

15. A manufacturing method of an active matrix substrate including a plurality of oxide semiconductor TFTs,
wherein the plurality of oxide semiconductor TFTs include a first TFT formed in a first TFT formation region and a second TFT formed in a second TFT formation region, the manufacturing method comprising:
(A) forming a first oxide semiconductor film on a substrate in each of the first TFT formation region and the second TFT formation region;
(B) forming a first oxide semiconductor layer to be an active layer of the first TFT in the first TFT formation region, and removing the first oxide semiconductor film in the second TFT formation region by patterning the first oxide semiconductor film;
(C) forming a first insulating film in each of the first TFT formation region and the second TFT formation region, in which the first insulating film covers the first oxide semiconductor layer;
(D) forming a second oxide semiconductor film having a higher mobility than the first oxide semiconductor film on the first insulating film in each of the first TFT formation region and the second TFT formation region;
(E) removing the second oxide semiconductor film in the first TFT formation region, and forming a second oxide semiconductor layer to be an active layer of the second TFT in the second TFT formation region by patterning the second oxide semiconductor film;
(F) forming a second insulating film in each of the first TFT formation region and the second TFT formation region, in which the second insulating film covers the second oxide semiconductor layer and the first insulating film;
(G) forming a first gate electrode in the first TFT formation region and a second gate electrode in the second TFT formation region by forming a first conductive film on the second insulating film and patterning the first conductive film by using a resist mask in which, when viewed from a normal direction of the substrate, the first gate electrode overlaps a part of the first oxide semiconductor layer, and the second gate electrode overlaps a part of the second oxide semiconductor layer; and
(H) patterning the first insulating film and the second insulating film,
wherein, in the first TFT formation region, a first gate insulating layer having a layered structure including the first insulating film and the second insulating film is formed between the first gate electrode and the first oxide semiconductor layer by patterning the first insulating film and the second insulating film by using the resist mask or the first gate electrode as a mask, and
in the second TFT formation region, a second gate insulating layer including the second insulating film is formed between the second gate electrode and the second oxide semiconductor layer by patterning the second insulating film by using the resist mask or the second gate electrode as a mask, and a lower insulating layer including the first insulating film is formed between the second oxide semiconductor layer and the substrate by patterning the first insulating film by using the second oxide semiconductor layer as a mask.

* * * * *